United States Patent
Wu et al.

(10) Patent No.: US 11,024,937 B2
(45) Date of Patent: Jun. 1, 2021

(54) HIGH POWER BROADBAND TERAHERTZ EMITTER WITH ENHANCED STABILITY AND BEAM POLARITY

(71) Applicant: The Government of the United States of America, as represented by the Secretary of the Navy, Arlington, VA (US)

(72) Inventors: Dong Ho Wu, Olney, MD (US); Louis M. Pecora, Alexandria, VA (US); Christopher Kim, Lorton, VA (US)

(73) Assignee: The Government of the United States of America, as represented by the Secretary of the Navy, Washington, DC (US)

(*) Notice: Subject to any disclaimer, the term of this patent is extended or adjusted under 35 U.S.C. 154(b) by 83 days.

(21) Appl. No.: 16/427,701

(22) Filed: May 31, 2019

(65) Prior Publication Data
US 2020/0036076 A1    Jan. 30, 2020

Related U.S. Application Data

(60) Provisional application No. 62/711,028, filed on Jul. 27, 2018.

(51) Int. Cl.
*H01Q 1/02* (2006.01)
*H01L 31/0224* (2006.01)
(Continued)

(52) U.S. Cl.
CPC ........... *H01Q 1/02* (2013.01); *H01L 31/0224* (2013.01); *H01L 31/022408* (2013.01);
(Continued)

(58) Field of Classification Search
CPC ......... H01L 31/0224; H01L 31/022408; H01L 31/0304; H01L 31/09; H01L 31/108; H01Q 1/02; H01S 1/00
See application file for complete search history.

(56) References Cited

U.S. PATENT DOCUMENTS

| 5,729,017 A | 3/1998 | Brenner et al. |
| 7,609,208 B2 * | 10/2009 | Evans ................. H01Q 3/2676 343/700 MS |

(Continued)

FOREIGN PATENT DOCUMENTS

WO    WO-2009063733 A1 *    5/2009    ......... H01L 31/0304

OTHER PUBLICATIONS

"Coherent and incoherent terahertz beams measured from a terahertz photoconductive antenna," Dong Ho Wu, Benjamin Graber, Christopher Kim, S. B. Qadri, and Anthony Garzarella, Appl. Phys. Lett. 104, 051126 (Feb. 2014).

(Continued)

*Primary Examiner* — Mark R Gaworecki
(74) *Attorney, Agent, or Firm* — US Naval Research Laboratory; William P. Ladd

(57) ABSTRACT

Systems and methods are provided for enhancing the terahertz power output of a terahertz beam while increasing its stability and its beam polarity by implementing a pair of pinched ripple electrodes and a small flat section in the middle of each electrode. By using tight control over the design parameters and by exploiting the plasmonic effect and the superradiance effect, systems and methods according to embodiments of the present disclosure can achieve a dramatic improvement in the terahertz output power and beam quality as well as the beam stability.

20 Claims, 17 Drawing Sheets

(51) Int. Cl.
*H01L 31/09* (2006.01)
*H01L 31/0304* (2006.01)
*H01L 31/108* (2006.01)
*H01S 1/00* (2006.01)

(52) U.S. Cl.
CPC .......... *H01L 31/0304* (2013.01); *H01L 31/09* (2013.01); *H01L 31/108* (2013.01); *H01S 1/00* (2013.01)

(56) References Cited

U.S. PATENT DOCUMENTS

| | | | |
|---|---|---|---|
| 9,177,685 B1 | 11/2015 | Wu et al. | |
| 2006/0152412 A1 | 7/2006 | Evans et al. | |
| 2007/0194253 A1 | 8/2007 | Nishizawa et al. | |
| 2010/0052083 A1* | 3/2010 | Kasai | H01L 31/0352 257/431 |
| 2016/0377803 A1* | 12/2016 | Wu | G02B 6/10 359/639 |

OTHER PUBLICATIONS

"Failure mechanism of THz GaAs photoconductive antenna," Syed B. Qadri, Dong H. Wu, Benjamin D. Graber, Nadeemullah A. Mahadik, and Anthony Garzarella, Appl. Phys. Lett. 101, 011910 (Jul. 2012).

"Dicke effect in a multi-ripple wave guide," H. Lee and L. E. Reichl, Phys. Rev. B 77 205318 (May 2008).

"Transient photoconductivity in GaAs as measured by time-resolved terahertz spectroscopy," Matthew C. Beard, Gordon M. Turner, and Charles A. Schmuttenmaer; Phys. Rev. B 62, 15764 (Dec. 2000).

"Ultrafast high-field carrier transport in GaAs measured by femtosecond pump-terahertz probe spectroscopy," Shi, Yulei, Zhou, Qing-li, Zhang, Cunlin, and Jin, Bin; Applied Physics Letters, 93, 121115 (Sep. 2008).

"Generation and detection of terahertz radiation up to 4.5 THz by low-temperature grown GaAs photoconductive antennas excited at 1560 nm," Rämer, Jan-Martin, Ospald, Frank, von Freymann, Georg, and Beigang, Rene; Applied Physics Letters, 103, 021119 (Jul. 2013).

"Cherenkov Radiation from Femtosecond Optical Pulses in Electro-Optic Media," D. H. Auston, K. P. Cheung, J. A. Valdmanis, and D. A. Kleinman; Phys. Rev. Lett. 53, 1555; (Oct. 1984).

"Novel sources and detectors for coherent tunable narrow-band terahertz radiation in free space," Aniruddha S. Weling and David H. Auston, J. Opt. Soc. Am. B 13, 2783-2792 (Dec. 1996).

"Generation and detection of ultrabroadband terahertz radiation using photoconductive emitters and receivers," Shen, Y. C.. Upadhya, P. C., Beere, H. E., Linfield, E. H., Davies, A. G., Gregory, I. S., Baker, C., Tribe, W. R. and Evans, M. J., Applied Physics Letters, 85, 164-166 (Jul. 2004).

"Significant performance enhancement in photoconductive terahertz optoelectronics by incorporating plasmonic contact electrodes," C.W. Berry, N. Wang, M.R. Hashemi, M. Unlu, and M. Jarrahi; Nat. Commun. 4, 1622 (Mar. 2013).

"Observation of Gigawatt-Class THz Pulses from a Compact Laser-Driven Particle Accelerator," A. Gopal, S. Herzer, A. Schmidt, P. Singh, A. Reinhard, W. Ziegler, D. Brommel, A. Karmakar, P. Gibbon, U. Dillner, T. May, H-G. Meyer, and G. G. Paulus; Phys. Rev. Lett. 111, 074802 (Aug. 2013).

"Impulse response of photoconductors in transmission lines," Auston, D.H.; Quantum Electronics, IEEE Journal of , vol. 19, No. 4, pp. 639,648 (Apr. 1983).

"Picosecond photoconducting Hertzian dipoles," Auston, D. H., Cheung, K. P., and Smith, P. R., Applied Physics Letters, 45, 284-286 (May 1984).

"Temperature dependence of femtosecond electromagnetic radiation from semiconductor surfaces," Hu, B. B., Zhang, X.-C., and Auston, D. H., Applied Physics Letters, 57, 2629-2631 (Dec. 1990).

"Tunable, continuous-wave Terahertz photomixer sources and applications," Preu, S., Döhler, G. H., Malzer, S., Wang, L. J., and Gossard, A. C., Journal of Applied Physics, 109, 061301 (Mar. 2011).

"Enhancement of the output power of a terahertz parametric oscillator with recycled pump beam," Wu, Dong Ho and Ikari, Tomofumi, Applied Physics Letters, 95, 141105 (Oct. 2009).

"Failure mechanism of THz GaAs photoconductive antenna," Qadri, Syed B., Wu, Dong H., Graber, Benjamin D., Mahadik, Nadeemullah A., and Garzarella, Anthony, Applied Physics Letters, 101, 011910 (Jul. 2012).

"Highly tunable fiber-coupled photomixers with coherent terahertz output power," Verghese, S.; McIntosh, K.A.; Brown, E.R., Microwave Theory and Techniques, IEEE Transactions on , vol. 45, No. 8, pp. 1301,1309 (Aug. 1997).

"GaAs under Intense Ultrafast Excitation: Response of the Dielectric Function," Li Huang, J. Paul Callan, Eli N. Glezer, and Eric Mazur, Phys. Rev. Lett. 80, 185 (Jan. 1998).

\* cited by examiner

US 11,024,937 B2

HIGH POWER BROADBAND TERAHERTZ EMITTER WITH ENHANCED STABILITY AND BEAM POLARITY

CROSS REFERENCE TO RELATED APPLICATIONS

This application claims the benefit of U.S. Provisional Patent Application No. 62/711,028, filed on Jul. 27, 2018, which is incorporated by reference herein in its entirety.

FIELD OF THE DISCLOSURE

This disclosure relates to antennas, including photoconductive antennas.

BACKGROUND

Conventional photoconductive antennas are typically fabricated on a GaAs substrate by depositing a pair of parallel micro-strip electrodes. When a femtosecond laser impinges on the GaAs substrate in between the electrodes, the laser beam creates a surface plasma, which naturally resonates at the resonance frequency $2\pi f_p = \sqrt{ne^2/\varepsilon m^*}$ where n is the charge density, e is the unit electric charge (i.e., $1.62 \times 10^{-19}$ Coulomb), $\varepsilon$ is the electric permittivity, and $m^*$ is the effective mass of charge in the semiconductor. The plasma resonance in the photoconductive antenna effectively induces an oscillating surface current between the electrodes.

The surface current that is also called the photocurrent generates an electric field at a teraherz frequency, which is also known as the terahertz field. The terahertz field strength increases with the photocurrent. An application of a bias voltage to the electrodes increases the amplitude of plasma oscillation and hence the photocurrent. So terahertz field strength increases linearly with the bias voltage. However, the bias voltage also induces a bias current between the electrodes, which generates Joule heat. This Joule heat, along with the thermal energy of the femtosecond laser beam, creates a large number of thermal electrons, which interfere with the oscillating plasma. As a result, conventional photoconductive antennas, which allow such interferences, are unable to produce a strong terahertz beam. Also, the conventional antenna structure cannot efficiently dissipate the excessive heat resulted from the Joule heating and the laser thermal energy, so that the antenna temperature elevates exponentially, which leads to the formation of multi-grain-boundaries and short-circuited electrodes—damages that are permanent and irrecoverable to the photoconductive antenna.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Figure 1:
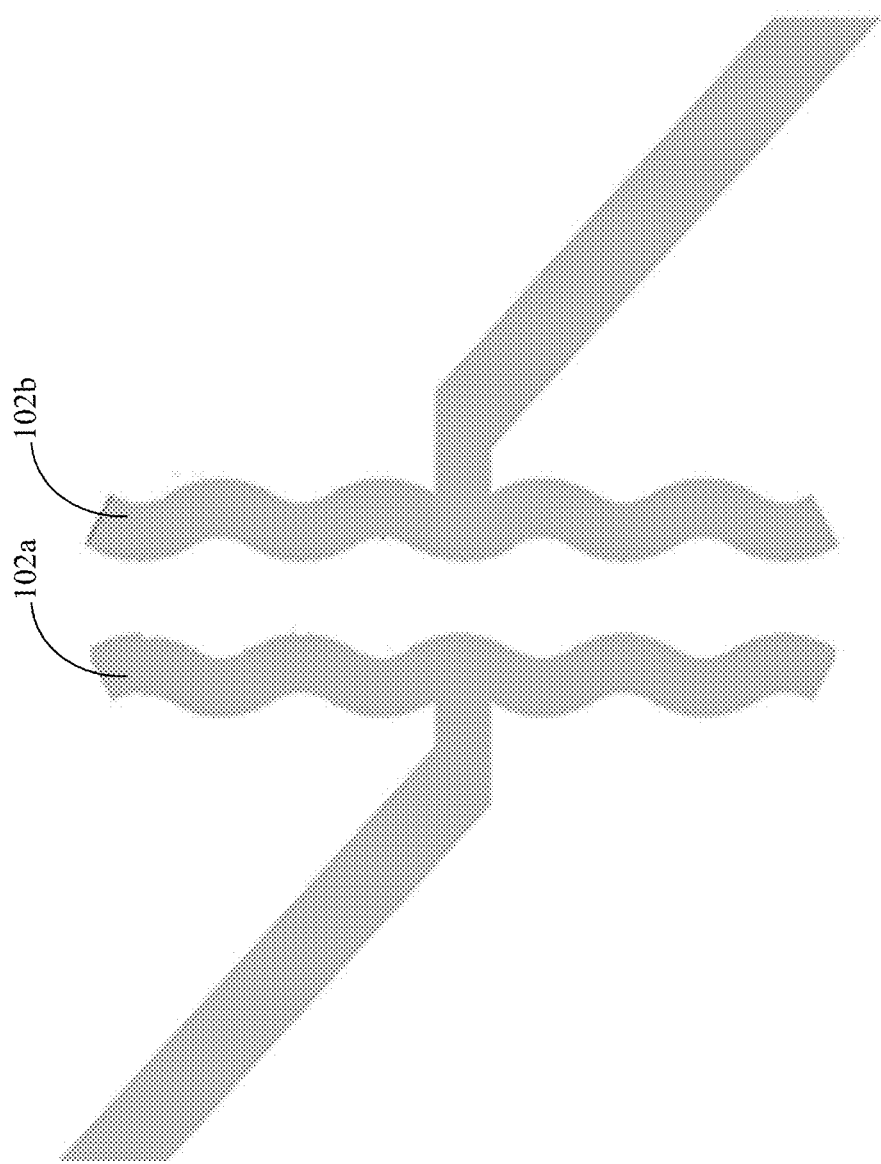
FIG. 1 is a diagram of a photoconductive antenna with rippled, curved electrodes in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to understand that such description(s) can affect such feature, structure, or characteristic in connection with other embodiments whether or not explicitly described.

1. Overview

Embodiments of the present disclosure provide systems and methods for enhancing the terahertz power output of a terahertz beam while increasing its stability and its beam polarity by implementing a pair of pinched ripple electrodes and a small flat section in the middle of each electrode. By using tight control over the design parameters and by exploiting the plasmonic effect, systems and methods according to embodiments of the present disclosure can achieve a dramatic improvement in the terahertz output power and beam quality as well as the beam stability. Consequently, a terahertz emitter with a pair of pinched ripple electrodes in accordance with an embodiment of the present disclosure can produce a highly polarized, coherent terahertz beam of which average power exceeds 6 mW (or 50 W in peak power), which is about 2-3 times stronger than what can be achieved with a photoconductive antenna containing chaotic shape electrodes. The terahertz power output is consistent over a long operation time, and this a photoconductive antenna in accordance with an embodiment of the present disclosure exhibits a substantially long device lifetime (e.g., >2 years).

2. Photoconductive Antennas with Rippled, Curved Electrodes vs. Photoconductive Antennas with Pinched Ripple Electrodes FIG. 1 is a diagram of a photoconductive antenna with rippled, curved electrodes 102 in accordance with an embodiment of the present disclosure. The photoconductive antenna of FIG. 1 alleviates some of the problems with conventional conventional photoconductive antennas described above. For example, the chaotic electrodes of the photoconductive antenna of FIG. 1 drive thermal electrons away from the plasma, resulting in enhanced terahertz output power and extended the device lifetime.

In an embodiment, electrodes 102 can be shaped in "chaotic geometries" since electrodes 102 can be configured to produce chaotic trajectories when a particle or wave bounces between electrodes 102. For example, with a minute variation of an initial condition, the trajectory can deviate, or vary, exponentially with time. In an embodiment, electrodes 102 are shaped using a ripple chaotic electrode geometry that includes a pair of wavy electrodes 102 at a variable distance apart. In an embodiment, the ratio of the coherent terahertz power to the total (coherent and incoherent) terahertz power for the ripple geometry is about 73% for the antenna. This is because a pair of ripple electrodes leads to chaotic electron trajectories. Furthermore, ripple electrodes 102 not only minimize the interference between the incoherent electron currents and coherent currents, but also convert the incoherent electron currents into coherent currents, further amplifying the coherent electron currents, which produce a more coherent terahertz beam.

In an embodiment, electrodes 102 are non-parallel electrodes. In an embodiment, electrodes 102 are deposited in separate trenches etched into a substrate. Further, in an embodiment, electrodes 102 can be electrically insulated from the trench walls by air-gaps and/or by an electrical insulation layer, in accordance with an exemplary embodiment of the present disclosure. With this electrical insulation, electrodes 102 can generate an electric field with a minimal bias current flowing between electrodes 102. In an exemplary embodiment, silicon-nitride (SiN) can be used as the material for an electrical insulation layer; however, one of ordinary skill in the art recognizes that other materials can be used as well.

Figure 2A:
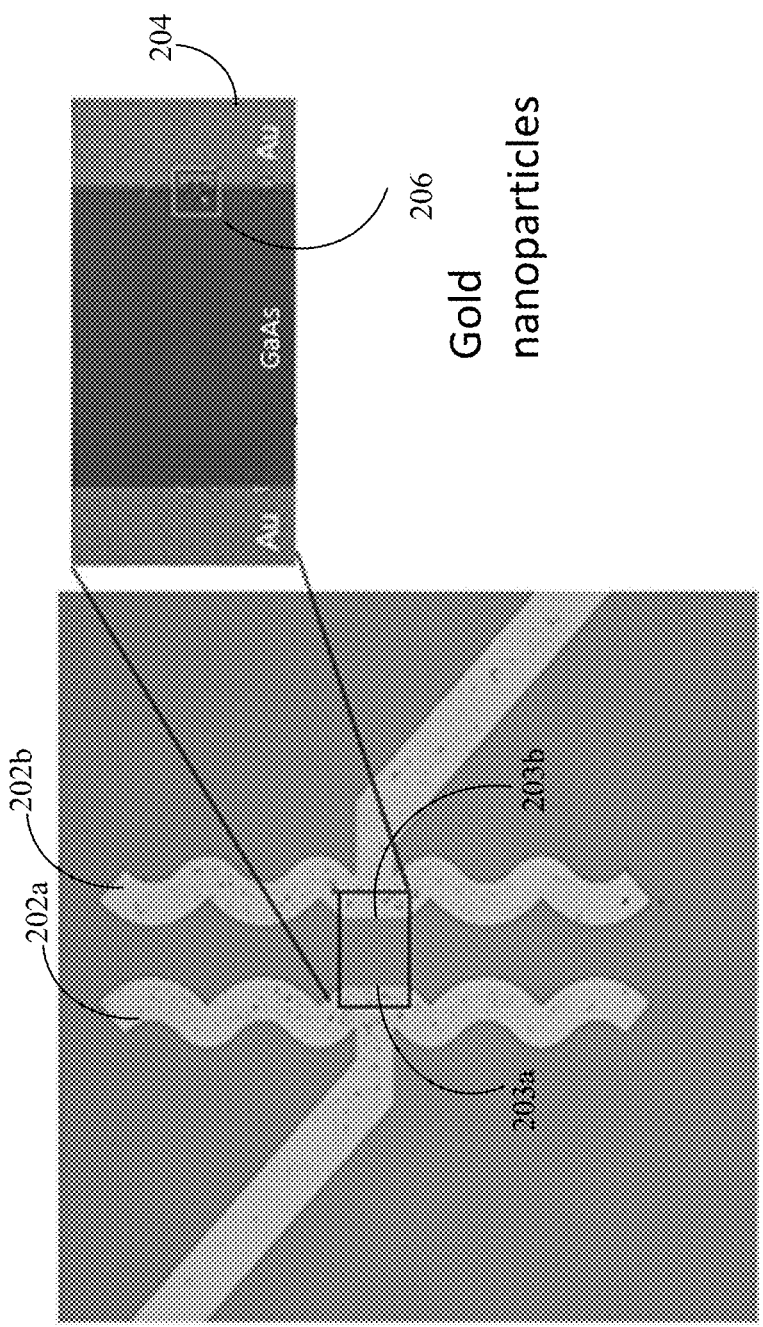
FIG. 2A is a diagram of a photoconductive antenna containing flat-center electrodes in accordance with an embodiment of the present disclosure.

While photoconductive antennas with chaotic shape electrodes can produce a much stronger terahertz beam than conventional photoconductive antennas can, previous photoconductive antennas using a pair of chaotic electrodes can have limitations, including: unstable terahertz output power, ill-defined terahertz beam polarization, lower than expected photon conversion efficiency, and short device lifetime. Embodiments of the present disclosure provide systems and methods using a pair of pinched ripple electrodes, as shown in FIG. 2A (explained in further detail below), which can overcome these limitations. Exemplary limitations of photoconductive antennas using a pair of chaotic, regular ripple electrodes and advantages of embodiments of the present disclosure will now be described in further detail.

2.1. Terahertz Output Power

As described above, photoconductive antennas using a pair of chaotic, regular ripple electrodes can have unstable terahertz output power. For example, a photoconductive antenna with a pair of chaotic electrodes often generates a terahertz beam that is somewhat unstable over the time. As shown in FIG. 1, the instability is due to the curvature in the middle of the electrodes, between which the surface plasma is created to produce a terahertz beam. When the plasma resonates between the curved boundaries of the electrodes, a small portion of the plasma may scatter away from the center, potentially resulting in an unstable plasma resonance and somewhat inconsistent terahertz power output. Throughout our experiments performed with several photoconductive antennas containing a pair of regular ripple electrodes, we have frequently seen such unstable and inconsistent terahertz power output.

2.2. Terahertz Beam Polarization

As described above, photoconductive antennas using a pair of chaotic, regular ripple electrodes can have ill-defined terahertz beam polarization. For example, photoconductive antennas with a pair of chaotic electrodes can exploit wave-chaotic dynamics and superradiance to enhance terahertz output power. In FIG. 1, electrodes 102 remove thermal electrons away from the plasma so that the plasma can resonate without being interrupted by the thermal electrons. Further, electrodes 102 drive the thermal electrons to be accumulated in the pockets of electrodes 102 to form bunched electrons. The locations of bunched electrons are within the wavelength of the terahertz beam from the plasma so that the bunched electrons can be stimulated by the terahertz near-field produced by the plasma. The stimulated electrons resonate and emit additional terahertz pulses.

Figure 3A:
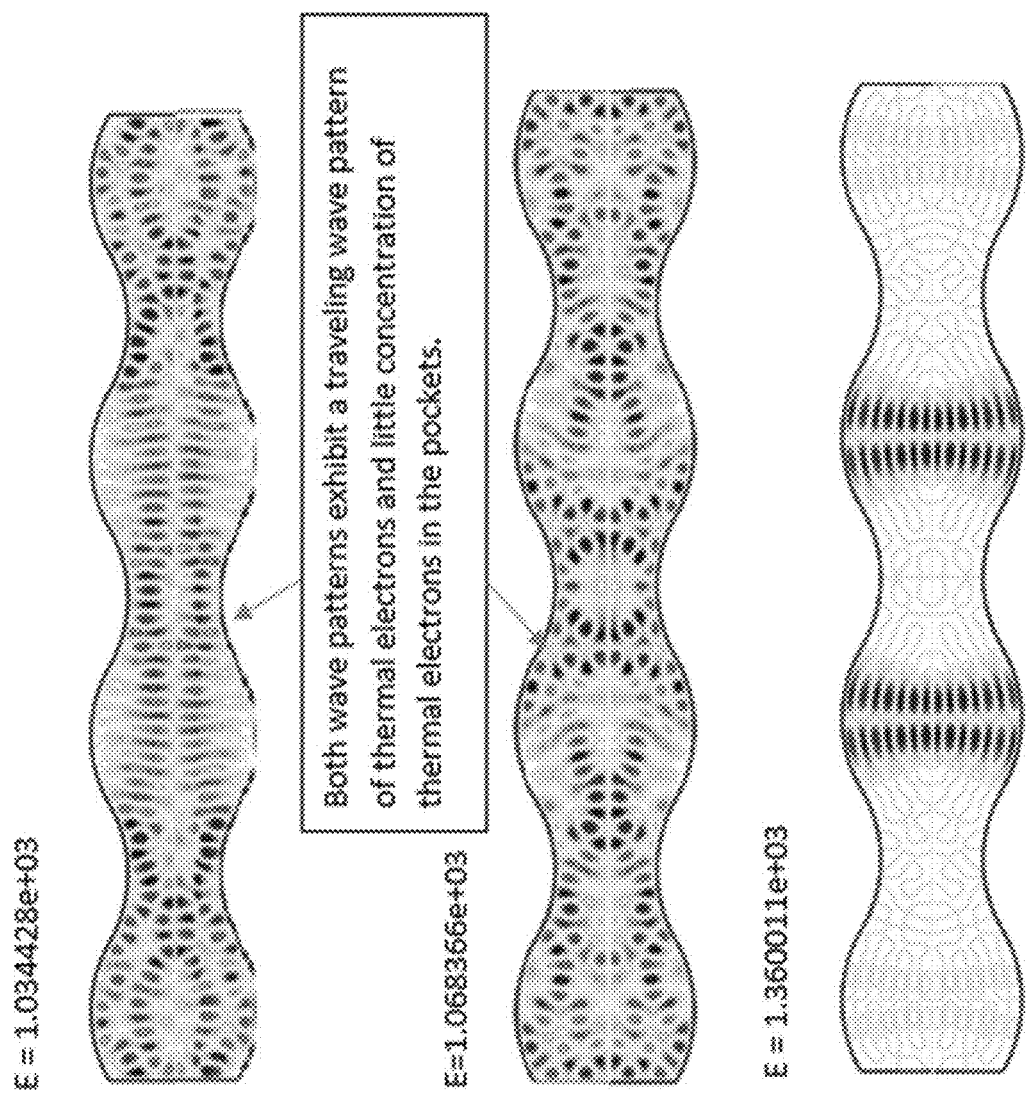
FIG. 3A is a diagram of wave patterns for regular ripple electrodes in accordance with an embodiment of the present disclosure.
Figure 3B:
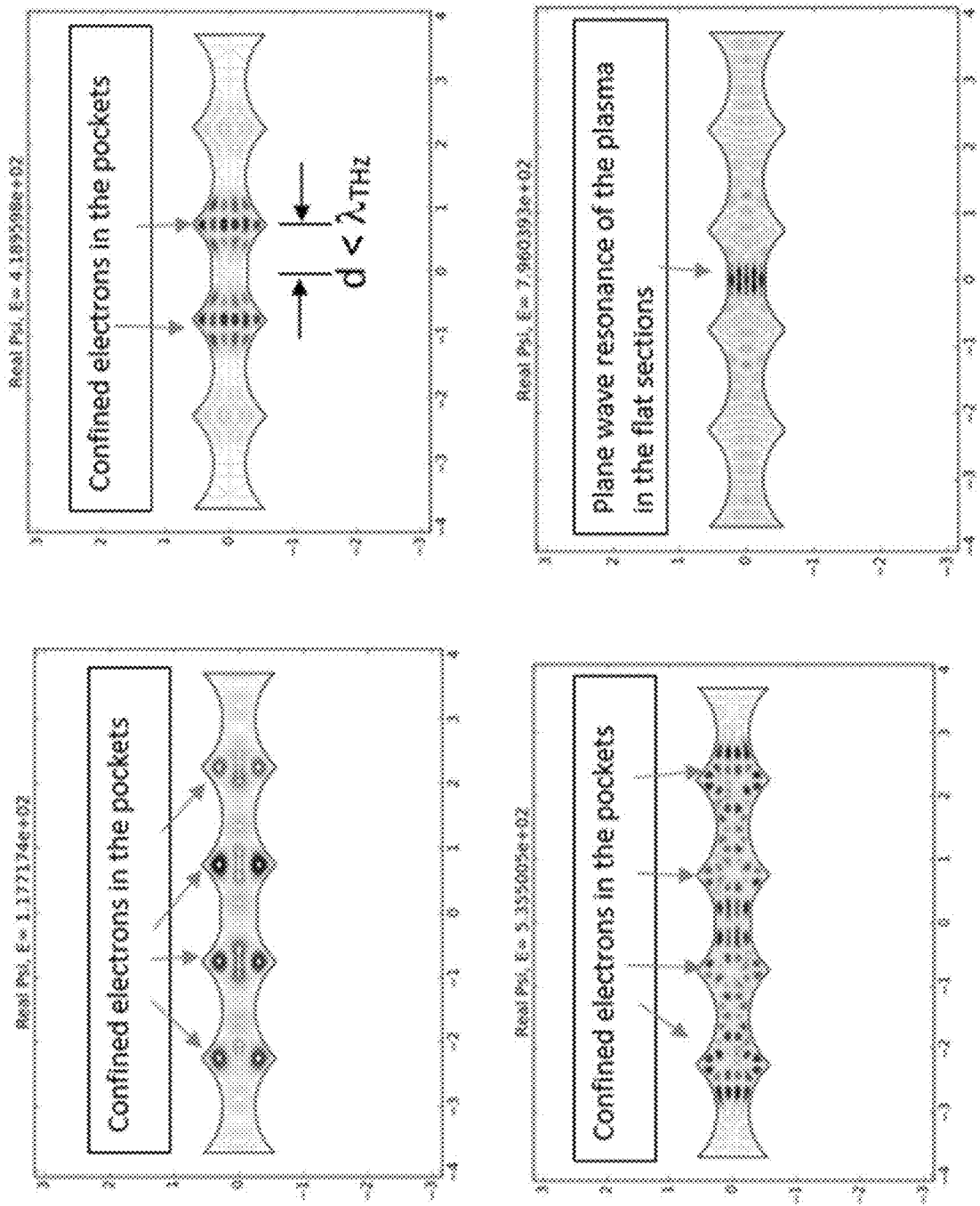
FIG. 3B is a diagram of wave patterns for pinched ripple electrodes in accordance with an embodiment of the present disclosure.

FIGS. 3A and 3B are diagrams showing wave patterns obtained from wave chaos dynamics simulations in accordance with an embodiment of the present disclosure. In FIGS. 3A and 3B, both a pair of ripple electrodes and a pair of pinched ripple electrodes drive thermal electrons away from the plasma, which is created by a pump laser beam at the center of the electrodes. Then the electrodes drive the electrons to be accumulated in the pockets of ripple electrodes to form bunched electrons. In FIGS. 3A and 3B, E is the excitation energy (or electron energy in an arbitrary unit), which is related to the resonance frequency for the wave pattern (or emission energy).

FIG. 3A is a diagram of wave patterns for regular ripple electrodes in accordance with an embodiment of the previous disclosure. In FIG. 3A, a pair of regular ripple electrodes often generate an ill-defined wave pattern and fail to confine the electrons (or electron wave-functions) within the pockets of the ripple electrodes, allowing them passing through between the electrodes. Hence a photoconductive antenna containing a pair of regular ripple-electrodes often produces an unstable terahertz beam with a marginal superradiance effect.

As FIG. 3A shows, often the regular ripple-electrodes cannot efficiently accumulate the thermal electrons in the pockets, often leaking the electrons in traveling wave patterns. Then, as the density of accumulated electrons is low, the stimulated radiation (i.e., superradiance) becomes weak or may not occur in the photoconductive antenna, making the overall terahertz output not as strong as we expected. Also, the resonance modes of the plasma and the bunched thermal electrons are typically in a circular pattern, which generates terahertz pulses whose polarizations are not linear, often ill-defined. Hence, for certain terahertz applications that require a linearly polarized terahertz beam, the photoconductive antenna containing the regular ripple electrodes may not be adequate.

FIG. 3B is a diagram of wave patterns for pinched ripple electrodes in accordance with an embodiment of the present disclosure. In contrast, in FIG. 3B, the pinched ripple electrodes tend to form a plane wave pattern and strictly confine waves (thermal electrons) inside the pinched ripple pockets. As a result, the antenna with pinched ripple electrodes produces a linearly polarized and stable terahertz beam that is also very powerful, largely due to strong superradiance effect (i.e., additional terahertz beam).

2.3. Photon Conversion Efficiency

Figure 2B:
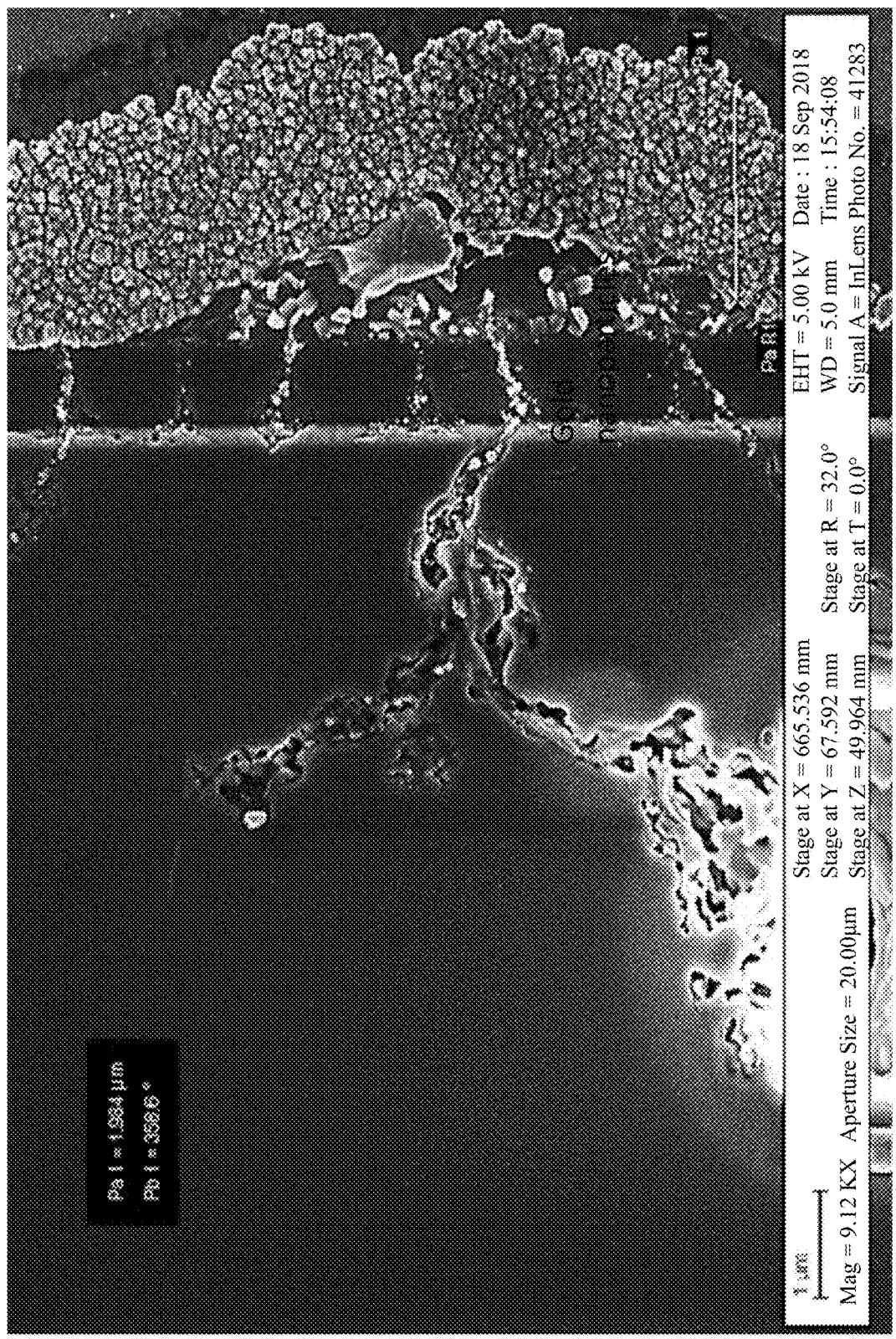
FIG. 2B is a diagram showing gold nanoparticles in accordance with an embodiment of the present disclosure.

As described above, photoconductive antennas using a pair of chaotic, regular ripple electrodes can have lower than expected photon conversion efficiency. For example, a photoconductive antenna converts near-infrared photons (e.g., a wavelength of 780 nm) of femtosecond laser into terahertz photons (e.g., wavelengths of 3 mm-85 μm). While the photon conversion efficiency of photoconductive antennas using a pair of chaotic electrodes is several times higher than those ($<3.7 \times 10^{-3}$) of conventional photoconductive antennas, embodiments of the present disclosure can further increase the photon conversion efficiency by embedding gold nanoparticles near the electrodes (as shown in FIG. 2B) and by strengthened superradiance. As described in further detail below, the gold nanoparticles, when exposed to the pump laser beam, induce the plasmonic effect, which substantially enhances the absorption of the pump laser photons and the photocurrent, which in turn dramatically increase the photon conversion efficiency and generate a stronger terahertz beam.

2.4. Device Lifetime

As described above, photoconductive antennas using a pair of chaotic, regular ripple electrodes can have a short device lifetime, For example, an exemplary photoconductive antenna can contain a pair of electrodes, which can be fabricated by depositing gold into shallow trenches etched on a GaAs substrate. For an exemplary photoconductive antenna, the gold deposition can be done by depositing shallow layers of Ni/Ge/Au/Ni/Au sequentially, followed by a rapid thermal anneal. This process creates Ohmic contact, which is a non-rectifying electric junction between the gold electrode and the GaAs semiconductor. With an Ohmic contact, the current through the junction increases linearly with the bias voltage as with Ohm's law, and the junction resistance is small. For this reason, a photoconductive antenna containing Ohmic contact electrodes tends to induce somewhat robust photocurrents and hence generates a relatively strong terahertz output for a given bias voltage. However, the small junction-resistance also results in a large bias current between the electrodes that generates excessive Joule heat, which leads to catastrophic failure of the photoconductive antenna.

To prevent such excessive Joule heat, the bias voltage is limited between the Ohmic contact electrodes to be far below 80V peak-to-peak. However, the limited bias voltage inadvertently reduces the terahertz output of the photoconductive antenna, typically to be much less than 0.5 mW of average power. Also, as there is no junction barrier in Ohmic contact electrodes, gold particles in the electrodes can readily migrate into the GaAs substrate when a high bias-current flows between the electrodes. Not only the high bias current elevates the substrate temperature, of which thermal energy promotes the electromigration of gold particles, but also the large current directly forces the gold particles to migrate into the GaAs substrate. So it is not uncommon to see that in a photoconductive antenna with Ohmic contact electrodes, even a moderate bias-voltage can cause the development of multi-grain boundaries (because of elevated temperature) and short-circuited electrodes (because of electromigration). As a result, the photoconductive antenna has a rather short device lifetime, usually much less than a year. Embodiments of the present disclosure with flat-center electrodes that contain gold nanoparticles produce terahertz power that is consistent over a substantially long device lifetime (>2 years).

3. Exemplary Photoconductive Antenna with Flat-Center Electrodes

FIG. 2A is a diagram of a photoconductive antenna containing flat-center electrodes 202 in accordance with an embodiment of the present disclosure. In FIG. 2A, the electrodes 202 are flat-center, pinched-ripple electrodes with gold nanoparticles embedded near the flat-center electrodes. Our experiments indicate that the curved electrodes 102 can destabilize the plasma oscillation and scatter the charges in the plasma. Hence, terahertz output often becomes unstable when using electrodes 102. To alleviate this problem, embodiments of the present disclosure replace the curved middle portion of electrodes 102 with a pair of small (e.g., <100 μm in length) flat segments 203, which are parallel against each other and immediately connected to pinched ripple electrodes 202.

In FIG. 2A, inserts 204 and 206 show a magnified view of the flat sections of electrodes 202, around which gold nanoparticles form dendrite patterns (e.g., referred to as "gold dendrites"). In an embodiment, the dendrite patterns are created after the photoconductive antenna is exposed to an intense laser beam while a high voltage bias is applied to the electrodes (e.g., an "operational annealing" process). In an embodiment, the gold nanoparticles induce the plasmonic effect, which substantially enhances the absorption of the pump laser photons and the photocurrent, which in turn dramatically increase the photon conversion efficiency and generate a stronger terahertz beam. FIG. 2B is a diagram showing gold nanoparticles 206 in accordance with an embodiment of the present disclosure.

Figure 2C:
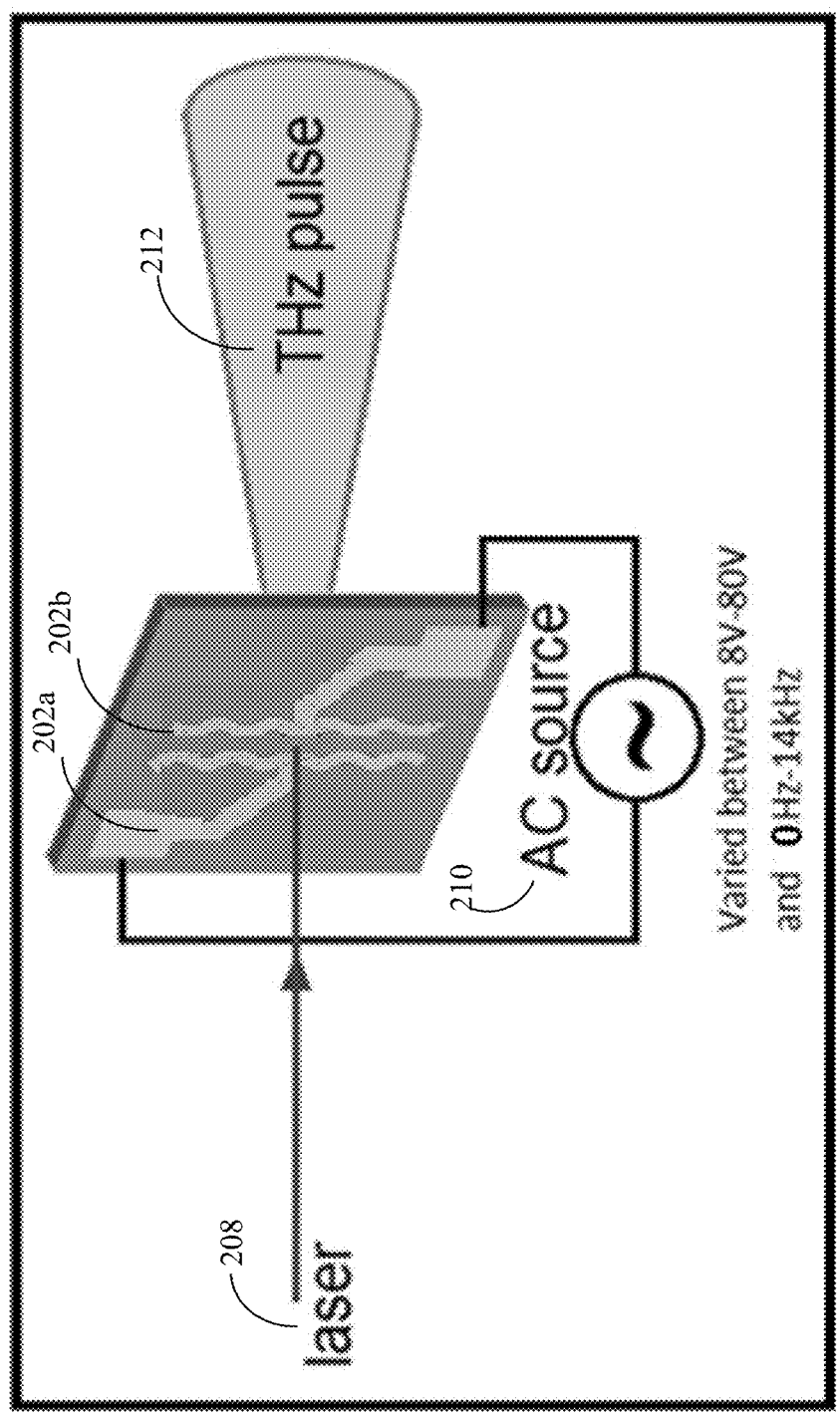
FIG. 2C is a diagram showing how a photoconductive antenna containing flat-center electrodes in accordance with an embodiment of the present disclosure can be used to generate a terahertz pulse.

FIG. 2C is a diagram showing how a photoconductive antenna containing flat-center electrodes 202 in accordance with an embodiment of the present disclosure can be used to generate a terahertz pulse 212. In an embodiment, a laser 208 (e.g., a femtosecond laser) irradiates a gap between electrodes 202. In an embodiment, electrodes 202 are powered by a power source, such as AC source 210 (e.g., in an embodiment, varied between 8V-80V and 0 Hz-14 kHz) of the photoconductive antenna. In an embodiment, plasma oscillations initiated by laser 208 generate the primary terahertz pulse 212.

Photoconductive antennas in accordance with embodiments of the present disclosure can implement several features to address the limitations of photoconductive antennas using a pair of chaotic, regular ripple electrodes and to improve performance. For example, photoconductive antennas in accordance with embodiments of the present disclosure can implement hybridized Schottky contact electrodes, gold nano-particles to exploit the plasmonic effect, flat segments in the middle of the pinched ripple electrodes, a pair of pinched ripple electrodes to create desirable patterns of bunched electrons, and design parameters optimized to take benefit of the superradiance effect. Exemplary advantageous features of photoconductive antennas in accordance with embodiments of the present disclosure will now be described in greater detail.

3.1. Hybridized Schottky Contact Electrodes

As explained above, a photoconductive antenna with Ohmic contact electrodes cannot tolerate a high bias voltage, so its power output is limited. Photoconductive antennas with ohmic contact electrodes are also susceptible to device-failure, resulting in a short device-lifetime. To alleviate these problems, embodiments of the present disclosure implement hybridized Schottky contact electrodes into photoconductive antennas. For example, in an embodiment, electrodes 202 are hybridized Schottky contact electrodes. In an embodiment, the Schottky contact electrodes (e.g., electrodes 202) are fabricated by depositing a 5 nm Titanium (Ti) layer, followed by a 45 nm gold (Au) layer into shallow trenches etched on a Gallium Arsenic (GaAs) substrate. In an embodiment, no thermal annealing is performed after the gold layer deposition. FIGS. 4-9 are diagrams showing the energy band, current, and differential resistance for Ohmic and Schottky contact electrodes. FIGS. 4-9 will now be discussed in greater detail.

Figure 4:
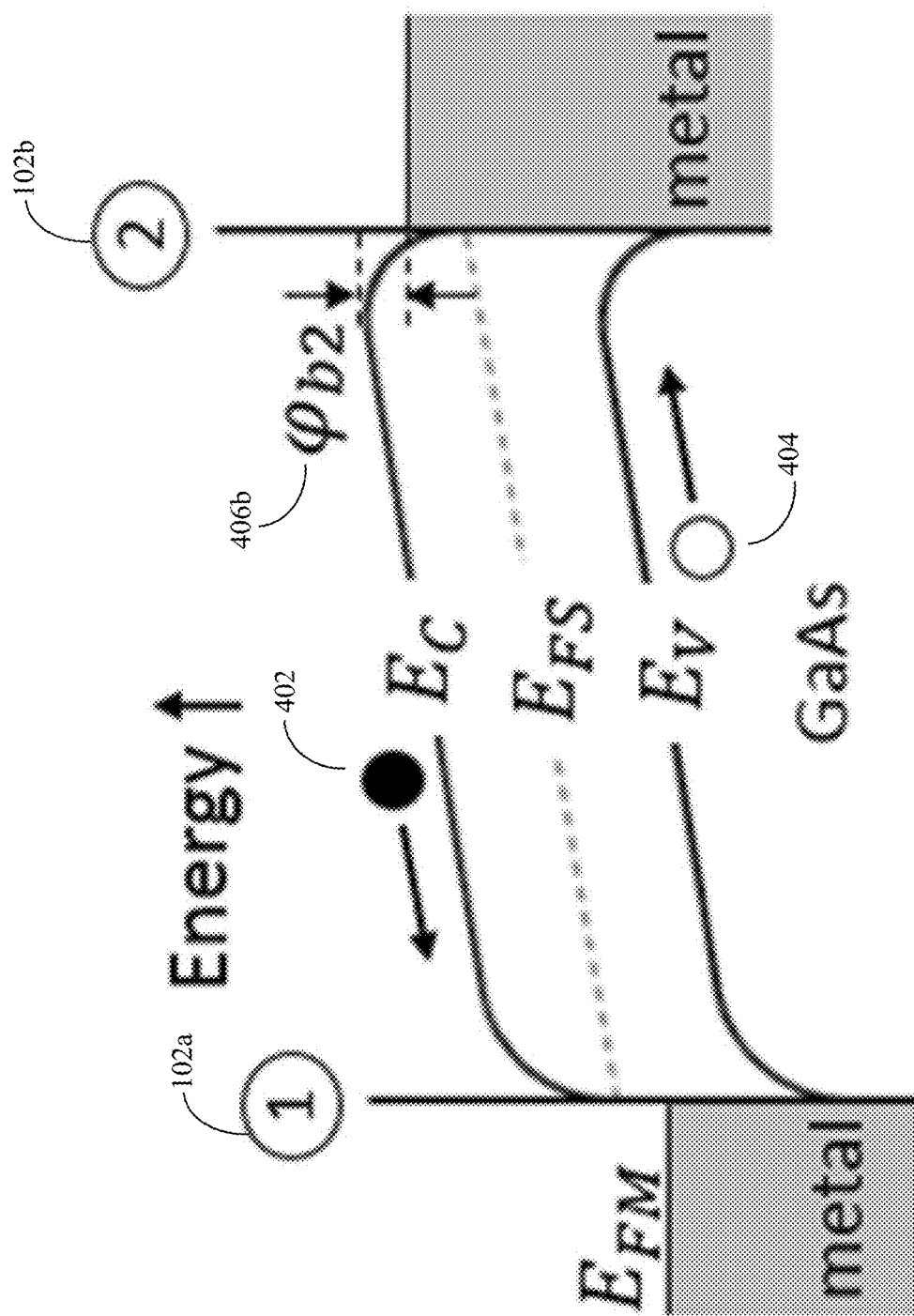
FIG. 4 is an energy band diagram of a pair of Ohmic contact electrodes in accordance with an embodiment of the present disclosure.
Figure 5:
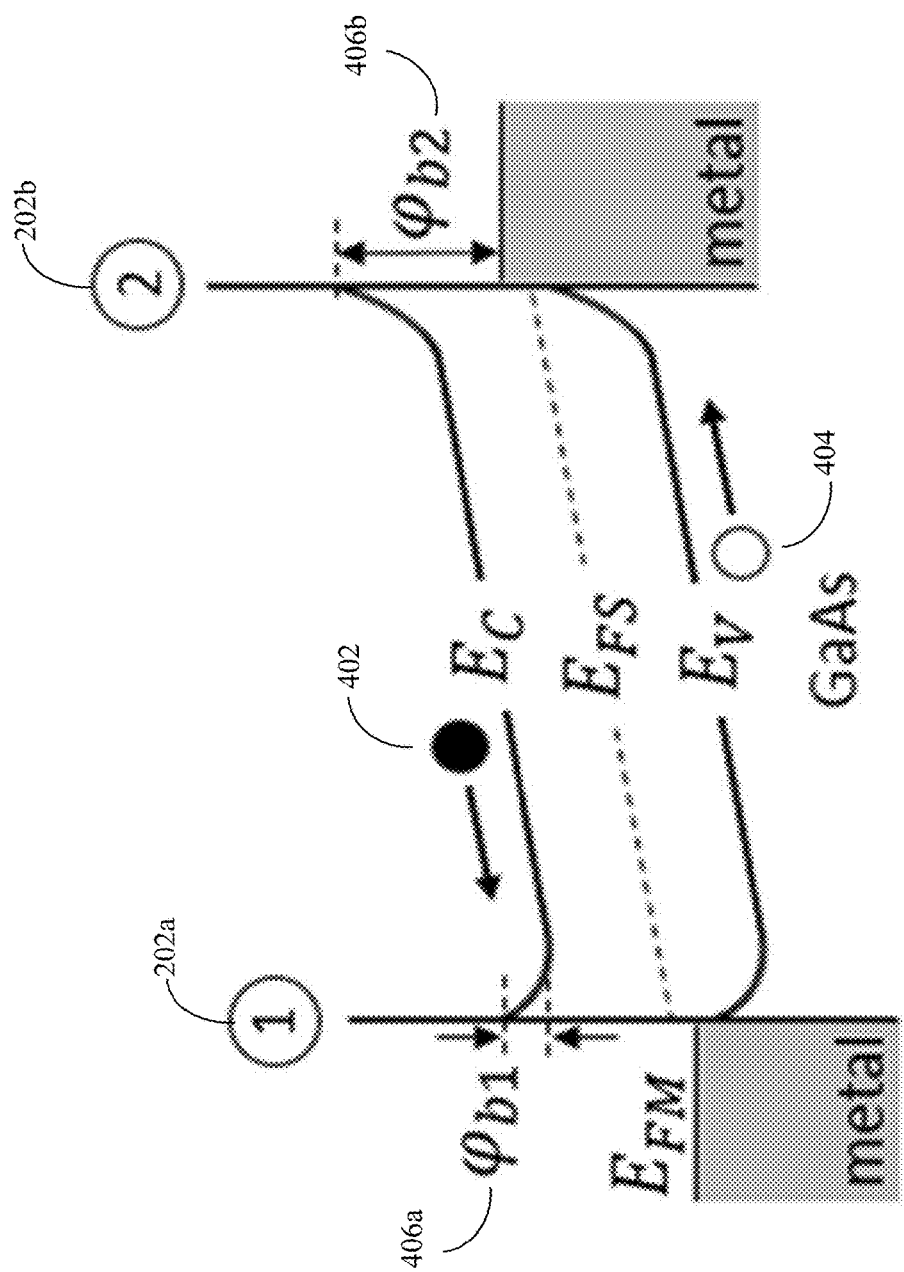
FIG. 5 is an energy band diagram of a pair of Schottky contact electrodes in accordance with an embodiment of the present disclosure.

FIG. 4 is an energy band diagram of a pair of Ohmic contact electrodes 102 in accordance with an embodiment of the present disclosure, and FIG. 5 is an energy band diagram of a pair of Schottky contact electrodes 202 in accordance with an embodiment of the present disclosure. In FIGS. 4 and 5, $E_c$ is the conduction band energy, $E_v$ is the valence band energy, $E_{FM}$ is the metal Fermi level, $E_{FS}$ is the semiconductor Fermi level, and $\varphi_{b2}$ is the potential barrier. The black dot 402 indicates the electron, and the open-circle 404 represents the hole. In FIG. 5, $\varphi_{b1}$ 406a and $\varphi_{b2}$ 406b are the potential barriers at the junctions. For example, $\varphi_{b1}$ 406a is a Schottky barrier that restricts the current flow.

Figure 6:
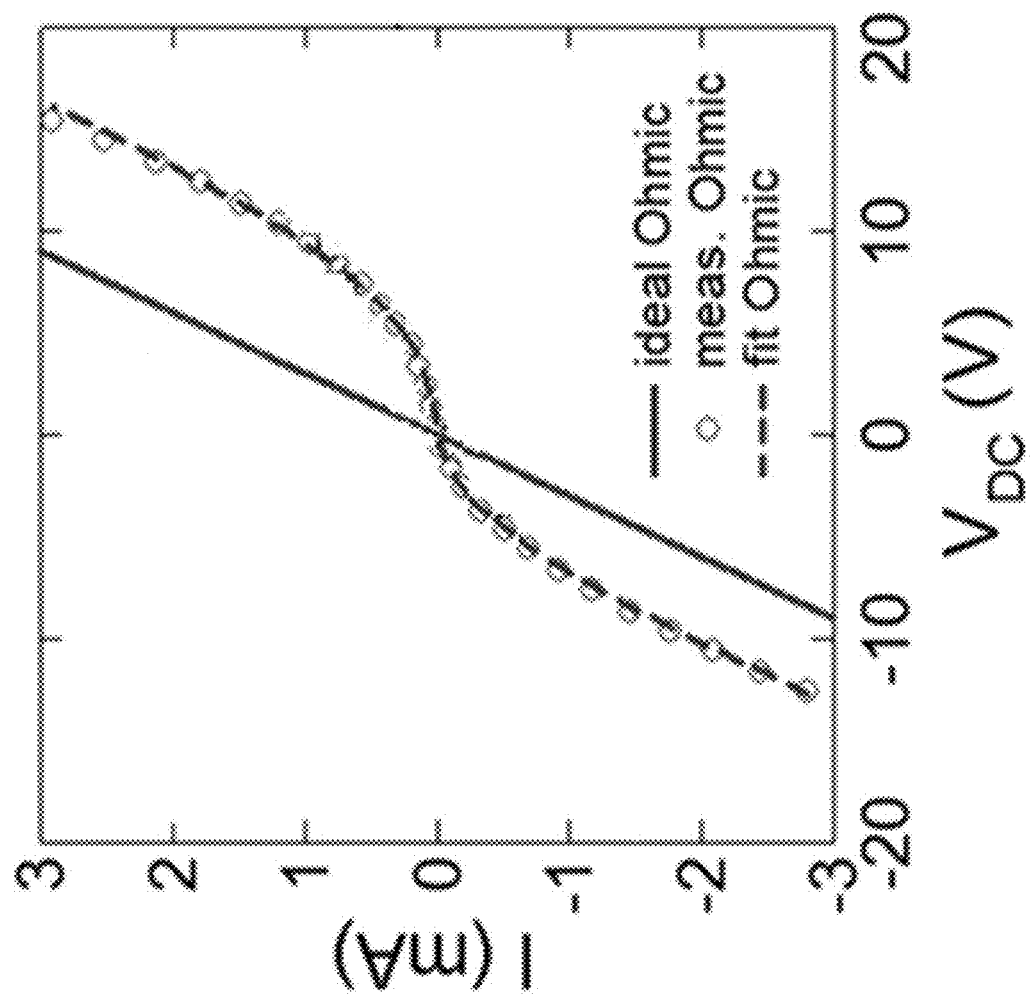
FIG. 6 is a diagram showing the current between two Ohmic contacts as a function of the bias voltage applied to the two contacts in accordance with an embodiment of the present disclosure.
Figure 7:
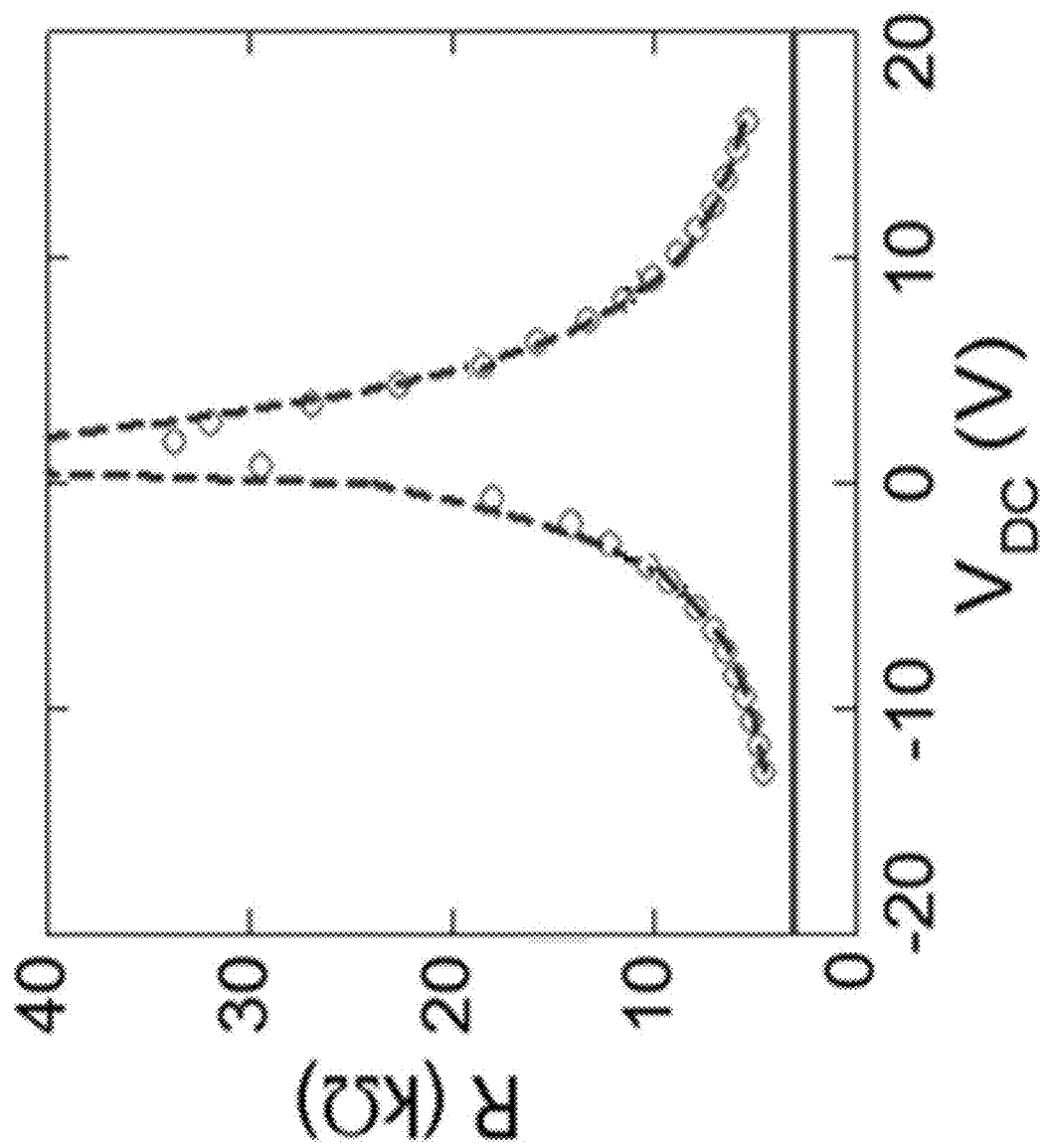
FIG. 7 is a diagram showing differential resistance (R=V/I) vs. the bias voltage between two Ohmic contacts in accordance with an embodiment of the present disclosure.

FIG. 6 is a diagram showing the current between two Ohmic contact electrodes 102 as a function of the bias voltage applied to the two Ohmic contact electrodes 102 in accordance with an embodiment of the present disclosure. In FIG. 6, the solid line represents the IV-curve of an ideal Ohmic contact, and the open circles show the actual data obtained from two Ohmic contact electrodes. The dashed line is a fit to the data from the open circles. FIG. 7 is a diagram showing differential resistance (R=V/I) vs. the bias voltage between two Ohmic contact electrodes 102 in accordance with an embodiment of the present disclosure. In FIG. 7, the open circles represent data obtained from the Ohmic contact electrodes. The dashed line is a fit to the data from the open circles.

Figure 8:
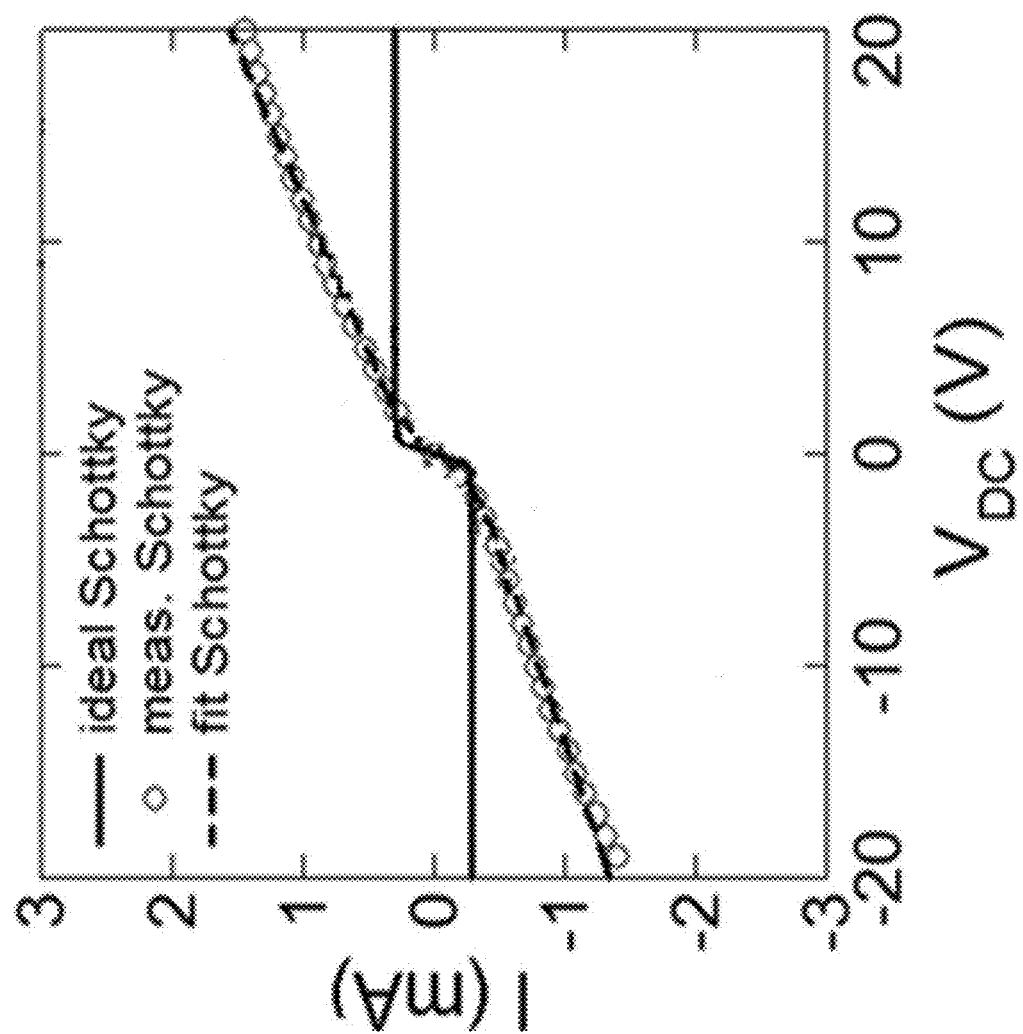
FIG. 8 is a diagram of the current between the two Schottky contacts as a function of the bias voltage applied to the two Schottky contacts in accordance with an embodiment of the present disclosure.
Figure 9:
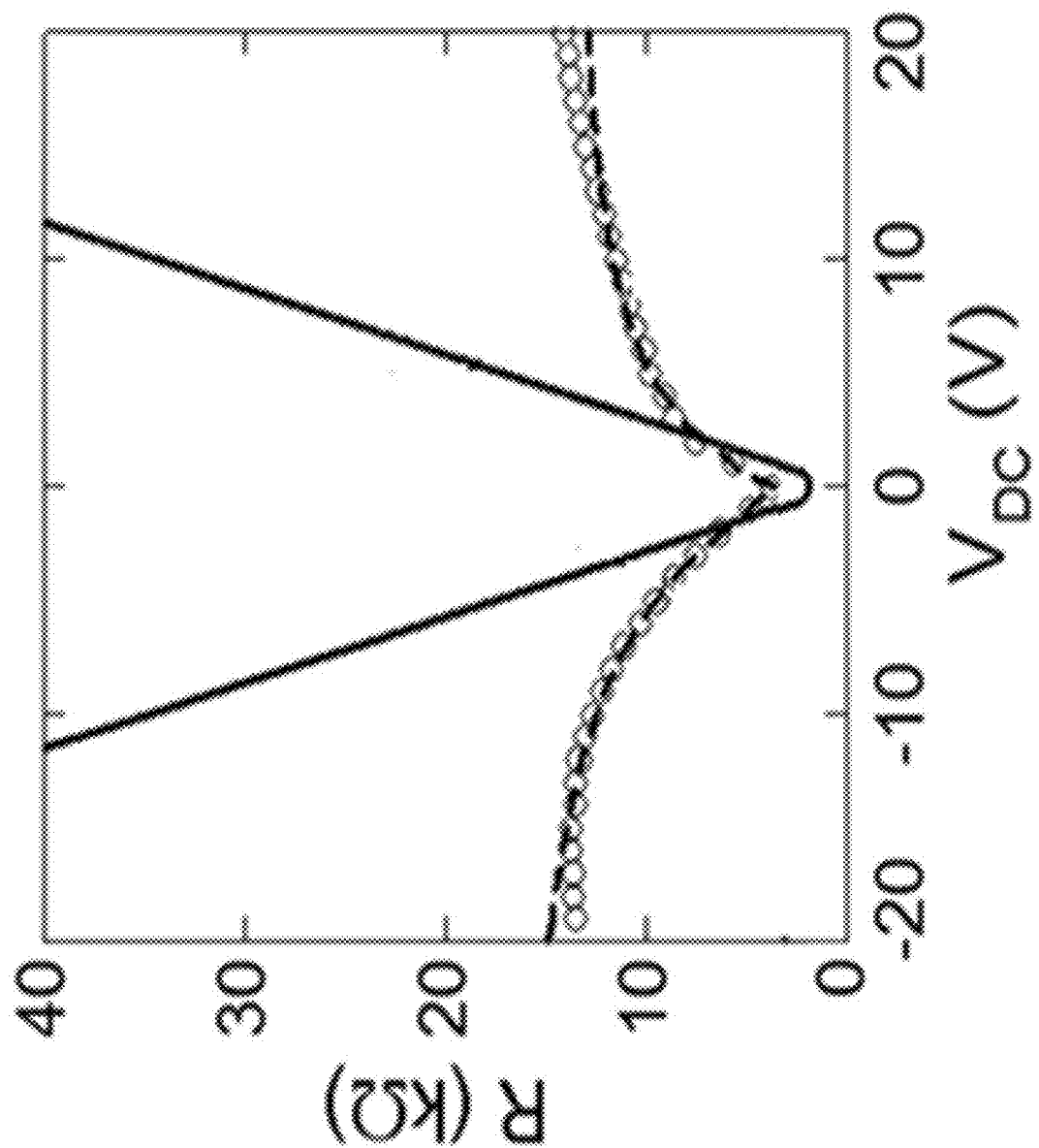
FIG. 9 is a diagram showing differential resistance (R=V/I) vs. the bias voltage between two Schottky contacts in accordance with an embodiment of the present disclosure.

FIG. 8 is a diagram of the current between two Schottky contact electrodes 202 as a function of the bias voltage applied to the two Schottky contact electrodes 202 in accordance with an embodiment of the present disclosure. In FIG. 8, the solid line is an I-V curve expected from an ideal Schottky contact electrode. The open circles represent data obtained from the Schottky contact electrodes 202. The dashed line is a fit to the data from the open circles. FIG. 9 is a diagram showing differential resistance (R=V/I) vs. the bias voltage between two Schottky contact electrodes 202 in accordance with an embodiment of the present disclosure. In FIG. 9, the open circles represent data obtained from the Schottky contact electrodes 202. The dashed line is a fit to the data from the open circles.

In an embodiment, electrodes 202 are hybridized Schottky contact electrodes that exhibit predominantly the Schottky contact behavior. As illustrated by FIGS. 4 and 5, in comparison to Ohmic contact electrodes 102, purely Schottky contact electrodes 202 are expected to have a relatively large and sharp junction barrier 406b, so that the resistance between the Schottky electrodes 202 is large, and the current between electrodes 202 is strictly limited to a minimum (as indicated by the solid lines in FIGS. 8 and 9).

In an embodiment, electrodes 202 are hybridized Schottky contact electrodes rather than purely Schottky contact electrodes. Hybridized Schottky contact electrodes, such as those in an embodiment of the present disclosure, display a compromised I-V curve between the purely Schottky behavior and the Ohmic behavior, shown as open circles in FIGS. 8 and 9. This hybridized Schottky contact behavior becomes more pronounced when an unconventional annealing process is performed, which can be called an "operational annealing process."

In an embodiment, for the annealing, electrodes 202 are exposed to an intense femtosecond laser beam for more than 60 minutes while applying a high bias voltage (~50 Vrms or 70 V peak-to-peak) across the two electrodes 202. The hybridized Schottky electrodes 202 can take advantages of both Schottky and Ohmic contacts so that the hybridized Schottky electrodes suppress electromigration of gold particles into the GaAs substrate and provide a controlled amount of bias current. In an embodiment, the bias current is comparatively stronger than that of Ohmic electrodes at a low bias voltage (e.g., |Vbias|<2V), but the current is reduced to a shallower slope at a high bias voltage, although not completely restricted, which is an ideal Schottky contact behavior, as can be seen in FIG. 8.

Figure 12:
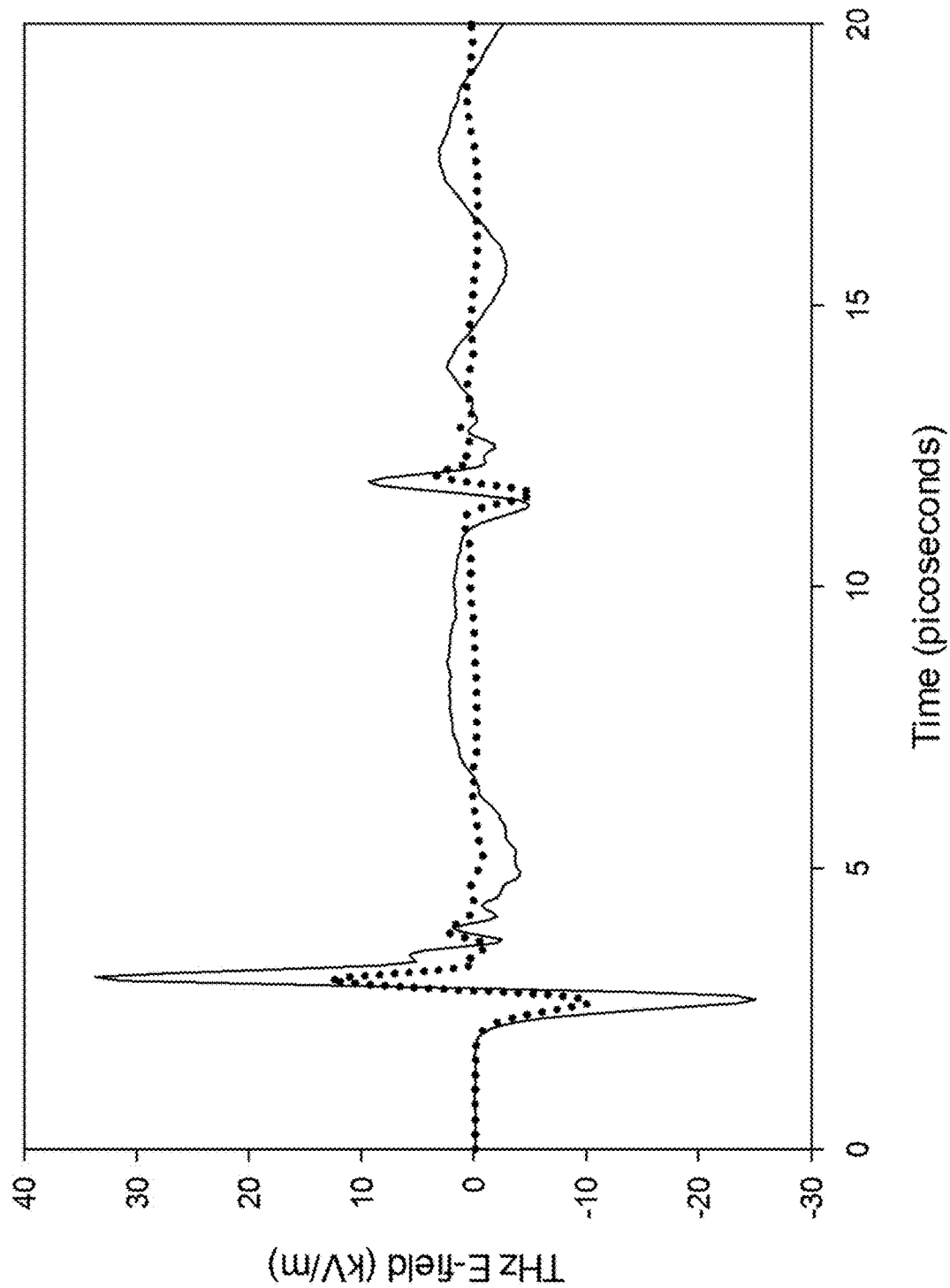
FIG. 12 is a diagram of an exemplary maximum terahertz field produced by a photoconductive antenna containing a pair of pinched ripple electrodes with the hybridized Schottky contact property in accordance with an embodiment of the present disclosure.

In an embodiment, due to the hybridized Schottky behavior, the bias current is considerably reduced compared to that of Ohmic contact electrodes 102, so it generates much less Joule heat, making the thermal problem manageable. Also, because of the low bias currents, electromigration of gold particles rarely occurs in a photoconductive antenna in accordance with an embodiment of the present disclosure even at a high bias voltage. As a result, photoconductive antennas in accordance with embodiments of the present do not develop multi-grain-boundaries and short-circuited electrodes, unless an extreme bias voltage (e.g., >110 V peak-to-peak) is constantly applied to the electrodes. Compared to an antenna containing Ohmic contact electrodes 102, which breaks down when the bias voltage exceeds 35-40 Vrms (or 50-56 V peak-to-peak), an antenna with hybridized Schottky contact electrodes 202 can be operated at a substantially high bias voltage (e.g., >60 Vrms or 85 V peak-to-peak), which in turn produces a strong terahertz beam. An example is shown in FIG. 12, which is discussed in more detail below.

In an embodiment, hybridized Schottky contact electrodes 202 substantially reduce the bias current even at a high voltage (e.g., >85 V peak-to-peak) so that it limits Joule heat to prevent temperature elevation of the photoconductive antenna and catastrophic failure of the antenna. In an embodiment, the Schottky contact electrodes 202 also effectively restrict electromigration of electrode materials (e.g., gold particles) into the GaAs substrate, reducing the chance of electric short-circuiting of electrodes 202. Hence, Schottky contact electrodes 202 can remarkably extend the device lifetime, which is consistent with our experiments performed with photoconductive antennas in accordance with embodiments of the present disclosure over an extended period (e.g., 2 years). Also, since terahertz power output increases with the bias voltage, and because a photoconductive antenna containing hybridized Schottky contact electrodes can tolerate a high bias voltage, antennas containing hybridized Schottky electrodes in accordance with embodiments of the present disclosure are capable of generating a high output power (e.g., >1.8 mW) from the plasma oscillation. As will be explained below, this strong terahertz primary signal from the plasma oscillation can be critical for the realization of superradiance, since without the high power terahertz signal from the plasma, it is not possible to stimulate electron clouds, which are at the pockets of pinched ripple electrodes.

3.2. Using Gold Nanoparticles to Exploit the Phasmonic Effect

In an embodiment, "operational annealing" of electrodes 202 develops aggregated gold nanoparticles on the electrodes and also nano-voids on the surface of a GaAs substrate in the vicinity of electrodes 202 and causes gold nanoparticles to migrate from electrodes 202 into the nano-voids to form dendrites near the electrodes (See FIG. 2B). In an embodiment, the typical size of gold particles is in the order of 80 (+/−20) nanometers. In an embodiment, when the femtosecond laser beam passes through the gold nanoparticles, the photon field induces charge separation in the gold particles, and the charges can be coupled with the photons of the femtosecond laser. (See FIG. 11.) Then, in an embodiment, the charges resonate at the frequency of the femtosecond laser beam, and the charge resonance occurs on the surface of the gold particles. This phenomenon, referred to as the surface plasmon wave (or surface plasmon resonance), enhances the absorption of the femtosecond laser photons. The overall phenomenon explained above is referred to as the plasmonic effect.

In an embodiment, the surface plasmon resonance frequency (wavelength) is dependent on the nanoparticle size. Our calculation indicates 80 nm gold particles induce the surface plasmon resonance when a 780 nm laser beam interacts with the particles imbedded in the GaAs substrate. Also, in an embodiment, the surface plasmon resonance enhances the photocurrent. Hence, in an embodiment, the plasmonic effect increases terahertz output power, as it enhances the absorption of femtosecond laser beam and the photocurrent in the photoconductive antenna.

In an embodiment, by exploiting the plasmonic effect, devices in accordance with embodiments of the present disclosure have a considerably high photon conversion efficiency and can produce a large photocurrent, which in turn generates a strong terahertz beam. Hereafter, we can refer to the terahertz beam generated by the plasma oscillation (i.e., the photocurrent) as the primary terahertz beam. In an embodiment, a strong primary terahertz beam is critical to achieving the superradiance effect, which drastically enhances terahertz power. In other words, a weak primary terahertz beam does not result in the superradiance effect. The superradiance effect will be discussed below in greater detail.

In an embodiment, before the "operational annealing" is processed, an antenna containing Schottky contact electrodes 202 in accordance with an embodiment of the present disclosure generates weaker terahertz output for a given bias voltage than those with Ohmic contract electrodes 102. In an embodiment, after the "operational annealing," an antenna with Schottky electrodes 202 in accordance with an embodiment of the present disclosure becomes comparable to or exceeds an antenna with Ohmic electrodes 102 in performance. In an embodiment, whereas the annealing process can result in severe damage to antennas with Ohmic electrodes 102, the process improves an antenna containing Schottky electrodes 202 in accordance with an embodiment of the present disclosure rather remarkably when small dendrites (see FIG. 2B) and gold nanoparticles form around electrodes 202.

Figure 10A:
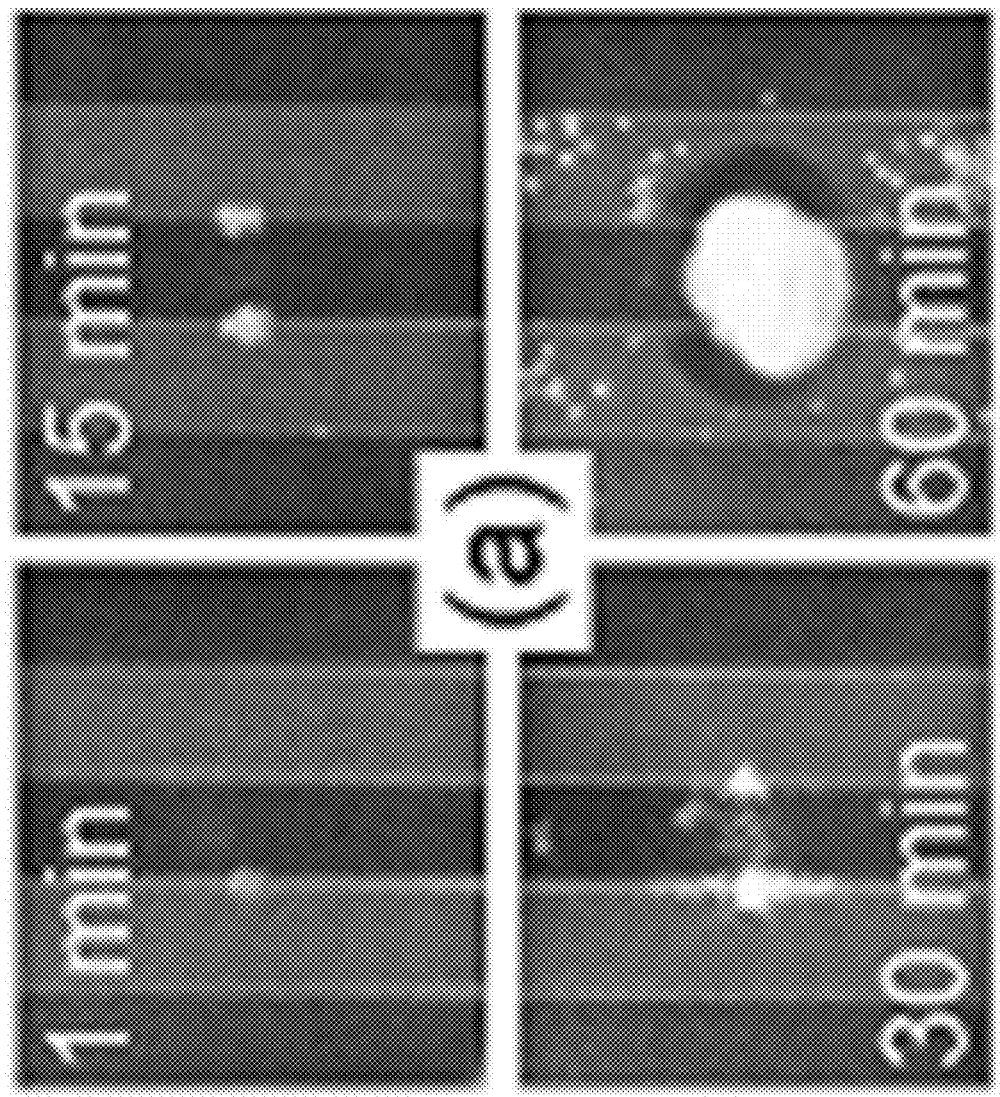
FIG. 10A is a collection of time-lapse photographs showing electromigration of gold particles from Ohmic contact electrodes of a conventional photoconductive antenna in accordance with an embodiment of the present disclosure.
Figure 10B:
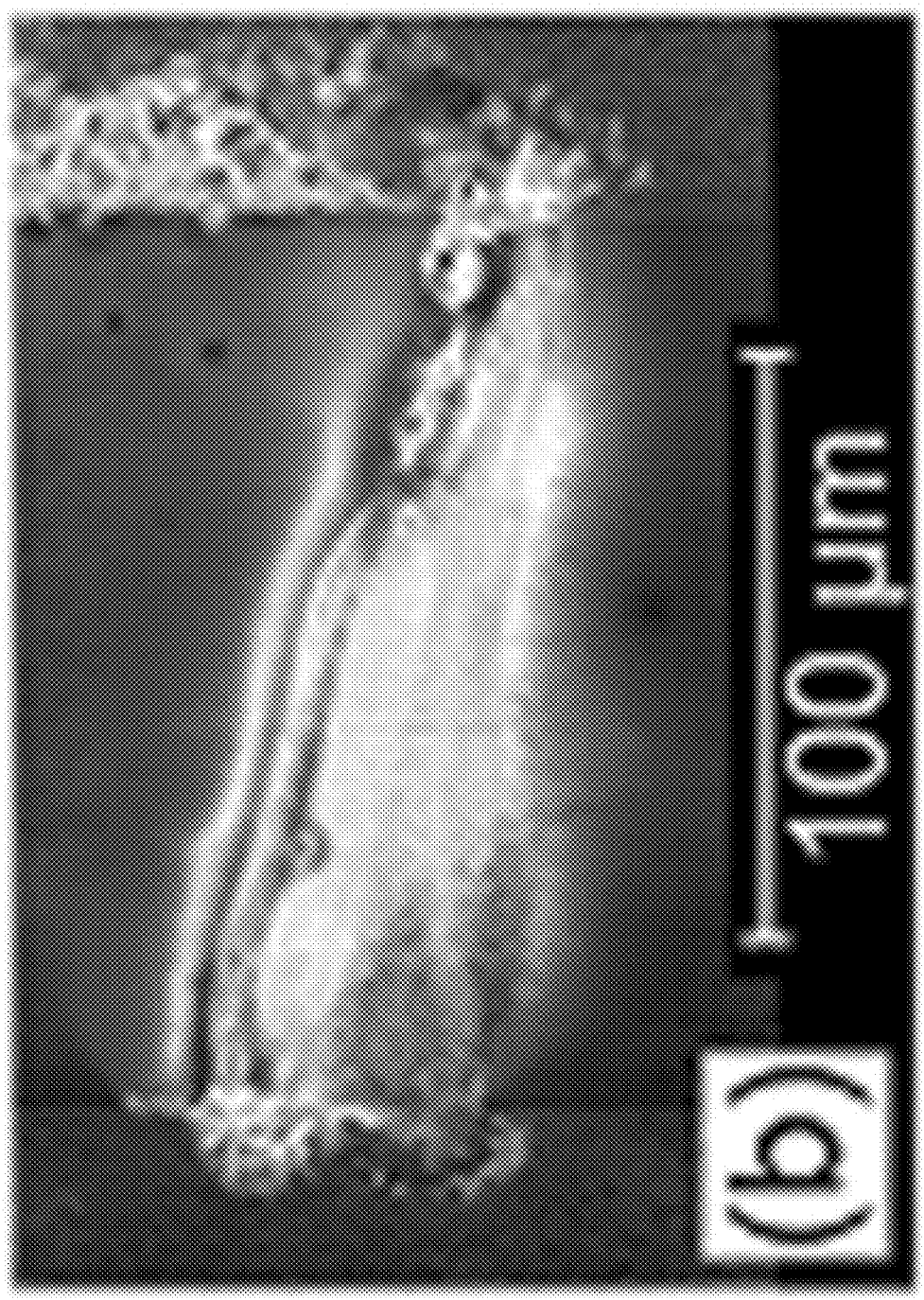
FIG. 10B is a scanning electron microscopy taken from the area reflecting the laser beam in accordance with an embodiment of the present disclosure.

FIG. 10A is a collection of time-lapse photographs showing electromigration of gold particles from Ohmic contact electrodes of a conventional photoconductive antenna in accordance with an embodiment of the present disclosure. These pictures were taken from a conventional photoconductive antenna containing a pair of parallel electrodes, which were fabricated using Ohmic contact deposition method. No rippled or pinched ripple structure was used. The experiment was performed to examine the Ohmic contact property, so the simplest shape for the electrodes was chosen. These photographs were taken while operating the photoconductive antenna with a 30 Vrms bias-voltage. Due to the electromigration of gold particles into the GaAs substrate (between the electrodes), the reflection of the femtosecond laser beam (as the pump laser) that illuminates the center area increases with time. The gold particles migrated into the GaAs substrate and eventually short-circuited the electrodes after 60 minutes, reflecting most of the laser beam as can be seen from the photograph on the bottom right corner of FIG. 10A. FIG. 10B is a scanning electron microscopy taken from the area reflecting the laser beam in accordance with an embodiment of the present disclosure. FIG. 10B shows short-circuited electrodes created by the electromigration of gold particles.

Figure 11:
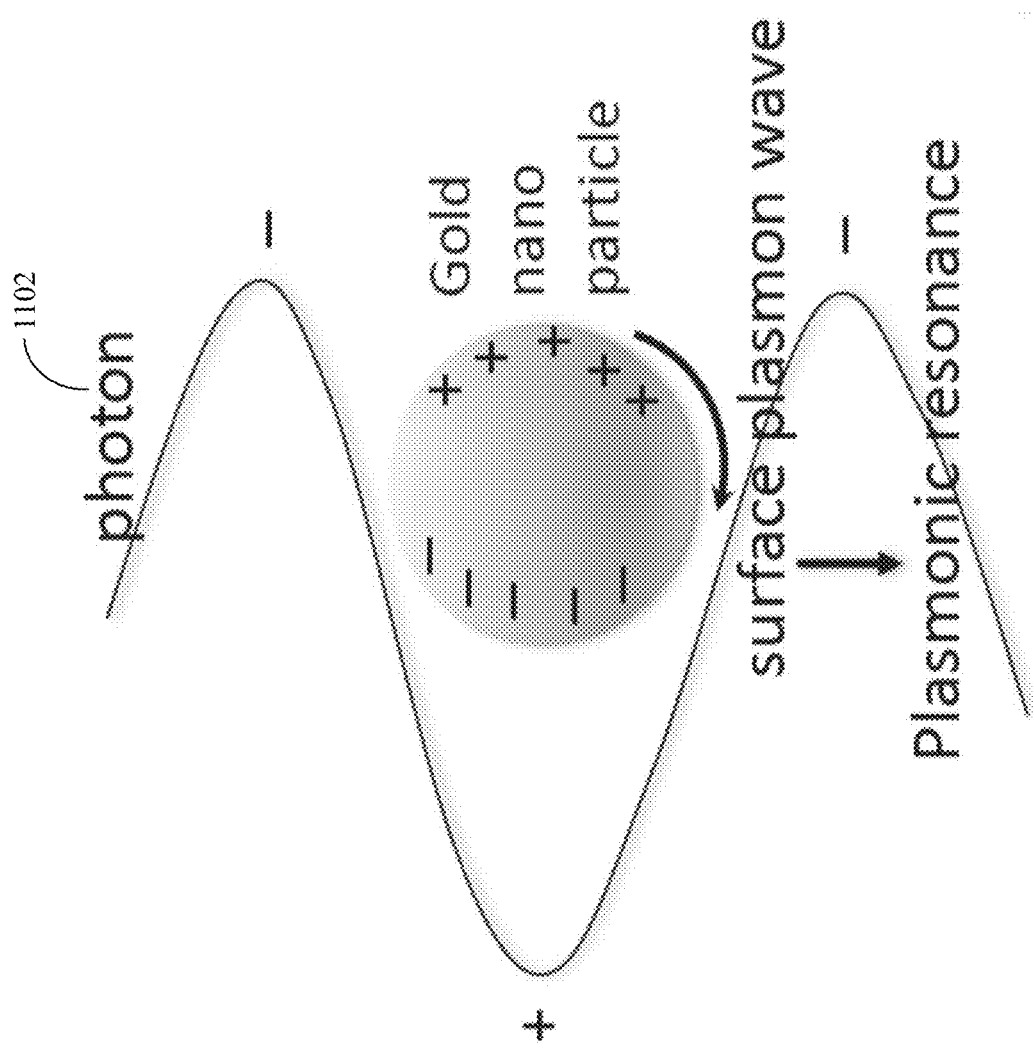
FIG. 11 is a diagram showing the plasmonic effect due to the gold nanoparticles in the dendrites in accordance with an embodiment of the present disclosure.

FIG. 11 is a diagram showing the plasmonic effect due to the gold nanoparticles in the dendrites in accordance with an embodiment of the present disclosure. In FIG. 11, the photon 1102 represents a laser beam, such as laser 208 (e.g., in an embodiment, a femtosecond laser beam). In an embodiment, the photon field induces charge separation in the gold nanoparticle and makes the charges resonate, which is referred to as the plasmonic resonance. In an embodiment, the charges resonate on the surface of the gold particles. In an embodiment, the charge resonance increases the photon absorption dramatically, as well as the photocurrent in the photoconductive antenna.

FIG. 12 is a diagram of an exemplary maximum terahertz field produced by a photoconductive antenna containing a pair of pinched ripple electrodes 202 with the hybridized Schottky contact property in accordance with an embodiment of the present disclosure. In FIG. 12, the maximum terahertz field is represented by the solid line. For this maximum terahertz field, the photoconductive antenna was operated at near the breakdown bias voltage (~120 V) and the maximum tolerable pump laser power (~350 mW). The dotted line represents a maximum terahertz field obtained with a previous terahertz photoconductive antenna with a pair of regular ripple electrodes.

3.3. Flat Segments in the Middle of Pinched Ripple Electrodes

In a photoconductive antenna in accordance with an embodiment of the present disclosure, the plasma created by a laser pulse from laser 208 (e.g., a femtosecond laser) oscillates in between electrodes 202. This plasma oscillation generates terahertz pulse 212. In an embodiment, femtosecond laser 208 (also referred to as the pump laser) excites the valence electrons from the GaAs semiconductor and move the electrons into the conduction band so that there are excited electrons and positive charges, which together form the plasma. In an embodiment, the plasma is created in the middle of electrodes 202, which naturally oscillates and produces terahertz pulse 212.

In an embodiment, the positive and negative charges of plasma recombine very quickly (e.g., <1 picosecond) and therefore generate a very weak terahertz beam (e.g., <1 µW in average power). In an embodiment, a bias voltage applied to electrodes 202 impedes the charge recombination and thus strengthens terahertz pulse 212. However, in an embodiment, the bias voltage also induces bias currents between electrodes 202, which produce Joule heat. In an embodiment, this Joule heat, along with the thermal energy of the pump laser beam, generates thermal electrons around the plasma. In an embodiment, the thermal electrons can interfere with the plasma and weaken the plasma oscillation and terahertz beam power.

In an embodiment, to reduce the thermal electron interference, chaotic electrodes 102 can be used to drive the thermal electrons away from the plasma. Of the chaotic electrodes 102 we tested, a pair of regular ripple electrodes produces the highest terahertz output (e.g., until the invention of pinched ripple electrodes). In an embodiment, the middle portion of the chaotic ripple electrodes 102 is curved, as shown in FIG. 1. While chaotic electrodes 102 reduce the thermal electron interference, our experiments indicate that the curved electrodes 102 can destabilize the plasma oscillation and scatter the charges in the plasma. Hence, terahertz output often becomes unstable when using electrodes 102.

To alleviate this problem, embodiments of the present disclosure replace the curved middle portion of electrodes 102 with a pair of small (e.g., <100 µm) flat segments 203, which are parallel against each other and immediately connected to pinched ripple electrodes 202, as shown in FIG. 2A. When the plasma resonates in between the two flat and parallel segments 203, the resonance mode is more stable than the one that resonates in between the convex electrodes (e.g., as shown in FIG. 1). Also, in an embodiment, these flat segments 203 excite resonance modes in a plane wave pattern, so that resulting terahertz beam is linearly polarized. (See FIG. 3B.) In an embodiment, the small flat segments 203 in the middle of the electrodes enables us to achieve a much more stable terahertz beam and a linearly polarized terahertz beam.

3.4. Using a Pair of Pinched Ripple Electrodes to Create Desirable Patterns of Bunched Electrons As explained above, Joule heat and the thermal energy of a pump laser beam (e.g., from laser 208) can create a large number of thermal electrons. These thermal electrons can interfere with the plasma and scatter charges, weakening the plasma resonance, which not only reduces terahertz output power but also makes terahertz pulse 212 unstable. To prevent the thermal electron interference with the plasma, electrodes in accordance with an embodiment of the present disclosure are designed so that flat segments 203 are immediately connected to pinched ripple electrodes 202, which drive the thermal electrons away from the plasma, which not only prevents the thermal electron interference but also helps dissipate heat away from the plasma. In an embodiment, electrodes 202 also drive the thermal electrons to be accumulated at the pockets of pinched ripple electrodes so that they form bunched electrons at the locations (See FIG. 3B). The locations of the nearest pockets are within the wavelength of the terahertz beam from the plasma. As will be explained later, a photoconductive antenna in accordance with an embodiment of the present disclosure utilizes these bunched electrons to produce additional terahertz beams—a phenomenon referred to as superradiance.

As a few examples can be seen in FIG. 3, with a pair of pinched ripple electrodes, the bunched electrons are denser and better aligned than those of regular ripple electrodes. Very often, regular ripple electrodes cannot tightly control the thermal electrons and allow them to channel through the electrodes so that the density of electrons is too low to emit superradiance (See FIG. 3A). In contrast, a pair of pinched ripple electrodes tightly controls the thermal electrons so that enough thermal electrons can be accumulated in the pockets to enable superradiance.

In an embodiment, the pinched ripple electrodes efficiently remove thermal electrons away from the plasma and accumulate them to form dense electron clouds at the pockets of the pinched electrodes so that when terahertz pulses are used for stimulation, the electron clouds generate spontaneous terahertz pulses. As terahertz fields of these emissions are coupled together, the total power of the spontaneous emissions increases quadratically with the number of emitters (i.e., electron clouds), making the total output remarkably strong. This phenomenon is referred to as superradiance.

3.5. More Efficient Superradiance

Systems and methods in accordance with embodiments of the present disclosure configure design parameters to fully utilize the superradiance effect so that additional terahertz power output can be dramatically increased. In an embodiment, to achieve a desired superradiance, a device should satisfy the following three requirements: (1) the density of the electron cloud should exceed a critical value; (2) the distance between the nearest electron clouds should be less than the terahertz wavelength; and (3) the strength of the primary terahertz field that stimulates the electron clouds should be strong enough to trigger collective spontaneous emissions from the electron clouds, which is superradiance.

Regarding the first requirement, in an embodiment, the electron density is directly related to the frequency of the emitted beam (e.g., terahertz pulse 212). In general, a photoconductive antenna is a broadband source that can cover from 50 (or 100) GHz to 3.5 THz with a maximum intensity at around 1 THz. A photoconductive antenna with pinched ripple electrodes in accordance with an embodiment of the present disclosure can extend the frequency range (e.g., due to superradiance) from 30 GHz to 5 THz. In an embodiment, this broadband terahertz pulse 212 is generated by quickly varying the density of electron clouds from $3.1 \times 10^{11}$ charges/cm$^3$ to $3.1 \times 10^{17}$ charges/cm$^3$ within 1.5 picoseconds. In an embodiment, such a quick variation of electron density occurs initially in the plasma created by the femtosecond laser beam whose pulse width is about 80 femtoseconds. Similarly, in an embodiment, the density of thermal electrons collected at the pockets of pinched ripple electrodes also quickly varies, although there can be a little time lag between the plasma and the electron clouds.

To satisfy the second requirement, the pockets of the pinched ripple electrodes 202 can be designed to be located within the shortest wavelength of the terahertz beam (e.g., ~60 μm). In an embodiment, the primary terahertz beam strength exceeds 1.8 mW, which satisfies the third requirement. So, the bunched electrons of the first two pockets from the plasma can emit spontaneous radiations (i.e., additional terahertz beams). Then, the spontaneous radiations (terahertz beams) can stimulate the second nearest electron clouds, which are located in the pockets near the end of the electrodes. In an embodiment, as the stimulation continues at an 80 MHz repetition rate, eventually all four sets of bunched electrons are stimulated by the near field of the terahertz pulse. In other words, the terahertz field produced by the plasma and four sets of electron clouds are coupled together.

Assuming that there are N terahertz emitters (i.e., the plasma and the bunched electron clouds), and each produces a terahertz field $E_{THz}$ and terahertz power output of $P_{THz}$, the total terahertz field can be represented by $E_{THz\_tot} = N\, E_{THz}$. Since terahertz power increases quadratically with the terahertz field (i.e., $P_{THz} \propto E_{THz}$), total terahertz power output can be represented by $P_{THz\_tot} \propto E_{THz\_tot}^2 = (\Sigma_1^N E_{THz\_i})^2 = N^2 E_{THz}^2 = N^2 P_{THz}$. So, in an embodiment, the total terahertz power output increases as N$^2$, not N (linearly with the number of emitters). The latter is the usual case with conventional devices.

In a photoconductive antenna in accordance with an embodiment of the present disclosure, there are five emitters (one plasma and four bunched electron clouds). In an embodiment, if all five emitters produce the same terahertz power, the total power output will be increased as much as 25 (=5$^2$) folds, which is substantial. In an exemplary photoconductive antenna in accordance with an embodiment of the present disclosure, the plasma generates a strong primary terahertz signal, of which average power is estimated to be about 1.8 mW, the power from the nearest electron clouds is estimated to be 0.22 mW, and the power from the electron clouds at the ends is estimated to be 0.75 μW. Our measurements indicate the total emitted terahertz power is about 6 mW, substantially larger than a linear summation of the power produced by each emitter, which would be only 2.02 mW. In fact, when we assess the total average power using the formula $P_{THz\_tot} = (\Sigma_1^N E_{THz\_i})^2$, the total terahertz power is about 6 mW, indicating the superradiance indeed occurs in photoconductive antennas in accordance with embodiments of the present disclosure. Thus, embodiments of the present disclosure exploit the superradiance effect to enhance the output of a terahertz photoconductive antenna.

4. Exemplary Advantages

As described in above, embodiments of the present disclosure advantageously include: hybridized Schottky contact electrodes, flat segments in the electrodes, pinched ripple electrodes in a photoconductive antenna, embedded gold nanoparticles in the flat segments of the electrodes to exploit the plasmonic effect, and the exploitation of superradiance to radically amplify a terahertz signal. Exploitation of the plasmonic effect and superradiance substantially enhance terahertz power. These features enable systems and methods in accordance with embodiments of the present disclosure to achieve several advantages over prior systems and methods. For example, a device in accordance with an embodiment of the present disclosure can have a high voltage operation, high ambient temperature tolerance, a substantially long device life, a linearly polarized terahertz beam, a high photon-conversion efficiency, a stable and consistent terahertz beam (e.g., little fluctuations over the short time period and minimal degradation over a long-term), and a high power terahertz pulse (e.g., >6 mW of average power or 50 W peak power).

Figure 13:
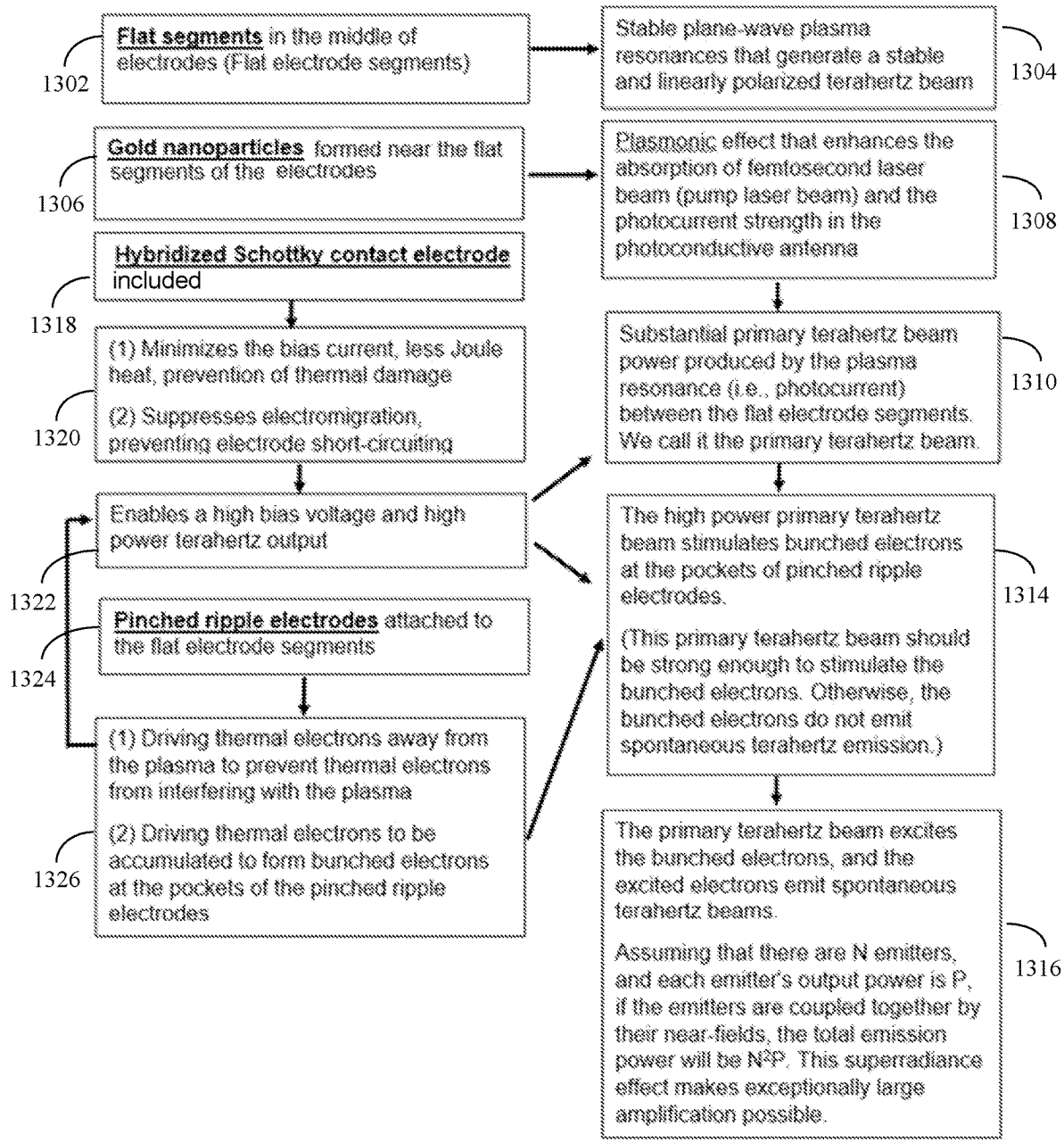
FIG. 13 is a diagram illustrating exemplary physical effects of aspects of embodiments of the present disclosure.

FIG. 13 is a diagram illustrating exemplary physical effects of aspects of embodiments of the present disclosure. By implementing hybridized Schottky contact electrodes and pinched ripple electrodes, systems and methods in accordance with embodiments of the present disclosure can minimize the problems associated with heat and tolerate a high bias voltage, which in turn enhances both the primary terahertz beam as well as the spontaneous emission. For example, in FIG. 13, including flat segments 1302 in the middle of electrodes in accordance with an embodiment of the present disclosure results in stable plane-wave plasma resonances that generate a stable and linearly polarized terahertz beam 1304.

Further, in FIG. 13, including gold nanoparticles 1306 in the dendrites formed near the flat segments of the electrodes in accordance with an embodiment of the present disclosure results in a plasmonic effect that enhances the absorption of femtosecond laser beam (pump laser beam) and the photocurrent strength in the photoconductive antenna 1308. This results in substantial primary terahertz beam power produced by the plasma resonance (i.e., photocurrent) between the flat electrode segments 1310. Further, the high power primary terahertz beam stimulates bunched electrons at the pockets of pinched ripple electrodes 1314. The primary terahertz beam excites the bunched electrons, and the excited electrons emit spontaneous terahertz beams 1316. Assuming that there are N emitters, and each emitter's output power is P, if the emitters are coupled together by their near-fields, the total emission power will be N$^2$P. This superradiance effect makes exceptionally large amplification possible.

Additionally, in FIG. 13, including a hybridized Schottky contact electrode 1318 in accordance with an embodiment of the present disclosure minimizes the bias current (resulting in less Joule heat and prevention of thermal damage) and suppresses electromigration, preventing electrode short-circuiting 1320. This enables a high bias voltage and high power terahertz output 1322. In an embodiment, the resulting high bias voltage and high power terahertz output 1322 contributes to the substantial primary terahertz beam power 1310 that stimulates the bunched electrons at the pockets of pinched ripple electrodes 1314.

Also, in FIG. 13, pinched ripple electrodes attached to the flat electrode segments 1324 in accordance with an embodiment of the present disclosure drives thermal electrons away from the plasma to prevent thermal electrons from interfering with the plasma and drives thermal electrons to be accumulated to form bunched electrons at the pockets of the pinched ripple electrodes 1326. In an embodiment, this contributes to enabling the high bias voltage and high power terahertz output 1322. In an embodiment, this also contributes to the substantial primary terahertz beam power 1310 that stimulates the bunched electrons at the pockets of pinched ripple electrodes 1314.

5. Exemplary Alternatives

Embodiments of the present disclosure are described above using a GaAs substrate and gold as an electrode material. However, it should be understood that other materials can be used as substrates and electrodes in accordance with embodiments of the present disclosure. Further, the dimensions of the device structure described above are given by way of example and not of limitation. For example, similar results described above can be achieved using somewhat altered dimensions or design parameters. These include the dimension of flat segments 203 in the middle of electrodes 202, the curvature of the pinched ripple electrodes 202, the distance of the pinches, the gap of the electrodes, and the width of the electrodes. For example, the electrode gap size can be in the range from a few tens of micrometers to a few hundred micrometers. Additionally, the photoconductive antenna is described above as a transmission mode terahertz emitter herein; however, one can slightly alter the design to demonstrate a reflection mode terahertz emitter.

6. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A photoconductive antenna, comprising:
   a substrate;
   a first electrode, deposited in the substrate, comprising a first flat segment; and
   a second electrode, deposited in the substrate, comprising a second flat segment, wherein the first electrode and the second electrode have respective pinched-ripple shapes, and wherein the first flat segment is parallel with the second flat segment.

2. The photoconductive antenna of claim 1, wherein the substrate is a Gallium Arsenide (GaAs) substrate, and wherein the first electrode and the second electrode are made of gold (Au).

3. The photoconductive antenna of claim 2, further comprising:
   a first titanium (Ti) layer between the substrate and the first electrode.

4. The photoconductive antenna of claim 2, further comprising:
   a second Ti layer between the substrate and the second electrode.

5. The photoconductive antenna of claim 1, wherein the first flat segment and the second flat segment are <100 μm in length, wherein the first flat segment is positioned at the center of the first electrode, and wherein the second flat segment is positioned at the center of the second electrode.

6. The photoconductive antenna of claim 1, further comprising:
   a first plurality of gold nanoparticles embedded in the first flat segment; and
   a second plurality of gold nanoparticles embedded in the second flat segment.

7. The photoconductive antenna of claim 1, further comprising:
   a first plurality of gold dendrites extending outward from the first flat segment; and
   a second plurality of gold dendrites extending outward from the second flat segment.

8. The photoconductive antenna of claim 7, wherein the first plurality of gold dendrites and the second plurality of gold dendrites are formed from a plurality of gold nanoparticles, and wherein the first plurality of gold dendrites and the second plurality of gold dendrites are configured to induce a plasmonic effect.

9. The photoconductive antenna of claim 1, wherein the first electrode and the second electrode are Schottky electrodes.

10. The photoconductive antenna of claim 9, wherein the first electrode and the second electrode are hybridized Schottky contact electrodes.

11. The photoconductive antenna of claim 1, wherein respective pockets formed by the pinched-ripple shapes of the first electrode and the second electrode are configured to accumulate electrons by removing them away from plasma, thereby forming a plurality of electron clouds.

12. The photoconductive antenna of claim 11, wherein the plurality of electron clouds are configured to generate respective terahertz pulses when a terahertz beam is applied to the first electrode and the second electrode such that a total power of emissions from the photoconductive antenna increases quadratically with a number of electron clouds in the plurality of electron clouds.

13. The photoconductive antenna of claim 11, further comprising:
a laser configured to apply a terahertz beam to the first electrode and the second electrode, wherein the pockets are configured to be located within a shortest wavelength of the terahertz beam.

14. An electrode for a photoconductive antenna, the electrode comprising:
a first pinched-ripple portion;
a flat segment coupled to the first pinched-ripple portion;
a second-pinched ripple portion coupled to the flat segment; and
a plurality of gold nanoparticles embedded in the flat segment.

15. The electrode of claim 14, further comprising:
a plurality of gold dendrites extending outward from the flat segment.

16. The electrode of claim 14, wherein the electrode is a hybridized Schottky contact electrode.

17. The electrode of claim 14, wherein respective pockets formed by the first pinched-ripple portion and the second pinched-ripple portion are configured to accumulate thermal electrons by removing them away from plasma, thereby forming a plurality of electron clouds.

18. The electrode of claim 17, wherein the plurality of electron clouds are configured to generate respective terahertz pulses when a terahertz beam is applied to the electrode such that a total power of emissions from the electrode increases quadratically with a number of electron clouds in the plurality of electron clouds.

19. A photoconductive antenna system, comprising:
a substrate;
a first Schottky contact electrode, deposited in the substrate, comprising a first flat segment;
a first plurality of gold nanoparticles embedded in the first flat segment;
a second Schottky contact electrode, deposited in the substrate, comprising a second flat segment, wherein the first Schottky contact electrode and the second Schottky contact electrode have respective pinched-ripple shapes comprising respective pluralities of pockets configured to accumulate electrons, and wherein the first flat segment is parallel with the second flat segment;
a second plurality of gold nanoparticles embedded in the second flat segment; and
a laser, coupled to the first electrode and the second electrode, wherein the laser is configured to emit a beam irradiating a gap between the first Schottky contact electrode and the second Schottky contact electrode, and wherein the respective pluralities of pockets are located within a shortest wavelength of the laser.

20. The photoconductive antenna system of claim 19, wherein the laser is a femtosecond laser configured to generate a terahertz pulse.

* * * * *